(12) United States Patent
Watt et al.

(10) Patent No.: US 11,434,387 B2
(45) Date of Patent: Sep. 6, 2022

(54) SOLVO-DYNAMIC PRINTING

(71) Applicant: Oxford University Innovation Limited, Oxford (GB)

(72) Inventors: Andrew Watt, Oxford (GB); Wing Chung Liu, Oxford (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 173 days.

(21) Appl. No.: 16/624,378

(22) PCT Filed: Jun. 22, 2018

(86) PCT No.: PCT/GB2018/051753
§ 371 (c)(1),
(2) Date: Dec. 19, 2019

(87) PCT Pub. No.: WO2018/234827
PCT Pub. Date: Dec. 27, 2018

(65) Prior Publication Data
US 2020/0215816 A1    Jul. 9, 2020

(30) Foreign Application Priority Data

Jun. 23, 2017  (GB) .................................. 1710091

(51) Int. Cl.
C09D 11/52      (2014.01)
B01L 3/00       (2006.01)
H05K 3/12       (2006.01)

(52) U.S. Cl.
CPC ........ *C09D 11/52* (2013.01); *B01L 3/502776* (2013.01); *B01L 3/502784* (2013.01);
(Continued)

(58) Field of Classification Search
CPC ..... B01L 2200/0636; B01L 2200/0673; B01L 2400/0487; B01L 3/502776;
(Continued)

(56) References Cited

U.S. PATENT DOCUMENTS

2005/0087122 A1* 4/2005 Ismagliov ............ G01N 35/08
                                                           117/2
2010/0155496 A1   6/2010 Stark et al.
(Continued)

FOREIGN PATENT DOCUMENTS

WO    2013/114114 A1    8/2013
WO    2017/064514 A1    4/2017

OTHER PUBLICATIONS

International Search Report & Written Opinion for WO2018/234827 (PCT/GB2018/051753), dated Aug. 29, 2018, pp. 1-12.
(Continued)

*Primary Examiner* — Mark Kopec
*Assistant Examiner* — Jaison P Thomas
(74) *Attorney, Agent, or Firm* — Thomas|Horstemeyer, LLP

(57) ABSTRACT

The invention provides a process for producing a printed article wherein a deposit liquid is provided to a substrate together with a carrier liquid. Also provided is a printed article obtained or obtainable by the process of the invention, such as a printed article. The invention further provides an apparatus suitable for carrying out the process of the invention, comprising devices configured to provide a flow of each of the deposit liquid and carrier liquid to a substrate, a flow channel for carrying each of the said liquids and an aperture through which at least the deposit liquid must pass. In some embodiments, the process of the invention is performed using the apparatus of the invention. The invention therefore also provides the use of the apparatus of the invention to perform the process of the invention.

22 Claims, 19 Drawing Sheets

(52) U.S. Cl.
    CPC .............. *H05K 3/12* (2013.01); *H05K 3/125* (2013.01); *B01L 2400/0487* (2013.01)

(58) Field of Classification Search
    CPC .... B01L 3/502784; B05B 7/0408; B41J 2/02; B41J 2/03; C09D 11/033; C09D 11/52; H05K 3/12; H05K 3/1241; H05K 3/125
    See application file for complete search history.

(56) References Cited

U.S. PATENT DOCUMENTS

| | | |
|---|---|---|
| 2010/0238232 A1 | 9/2010 | Clarke et al. |
| 2012/0075389 A1 | 3/2012 | Clarke et al. |
| 2013/0257994 A1 | 10/2013 | Panchawagh et al. |
| 2013/0257996 A1 | 10/2013 | Panchawagh et al. |
| 2013/0257997 A1* | 10/2013 | Panchawagh ............. B05C 5/00 347/65 |
| 2014/0001116 A1 | 1/2014 | Berthier et al. |
| 2014/0035975 A1 | 2/2014 | Essien et al. |
| 2018/0056288 A1* | 3/2018 | Abate ................ G01N 15/1484 |

OTHER PUBLICATIONS

Tanvir and Qiao (2012) Nanoscale Research Letters 7, 226.
Kwok and Neumann (1999) Advances in Colloid and Interface Science 81(3), 167-249.
International Preliminary Report on Patentability for WO2018/234827 (PCT/GB2018/051753), dated Dec. 24, 2019, pp. 1-9.
UK Search Report for GB1710091.8, dated Dec. 18, 2017, pp. 1-3.

* cited by examiner

Turbulent Flow

Laminar Flow

Discontinuous Flow

Parallel Flow

Fig. 12
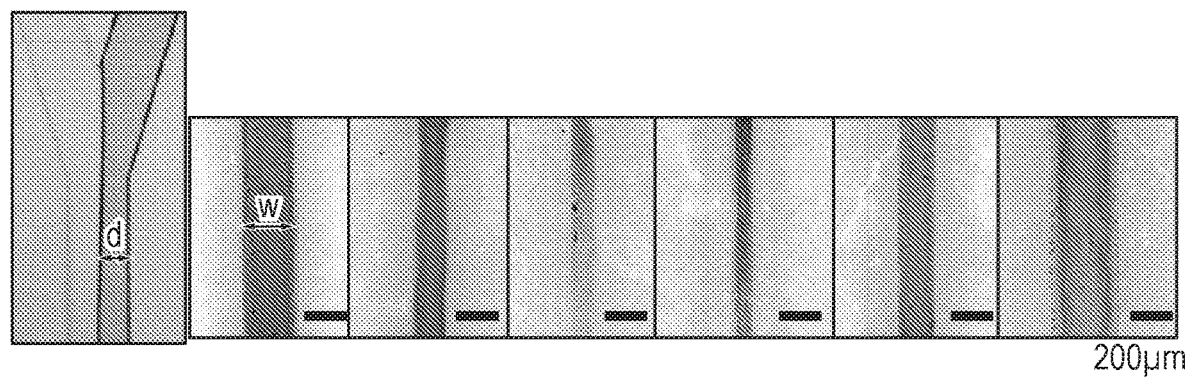
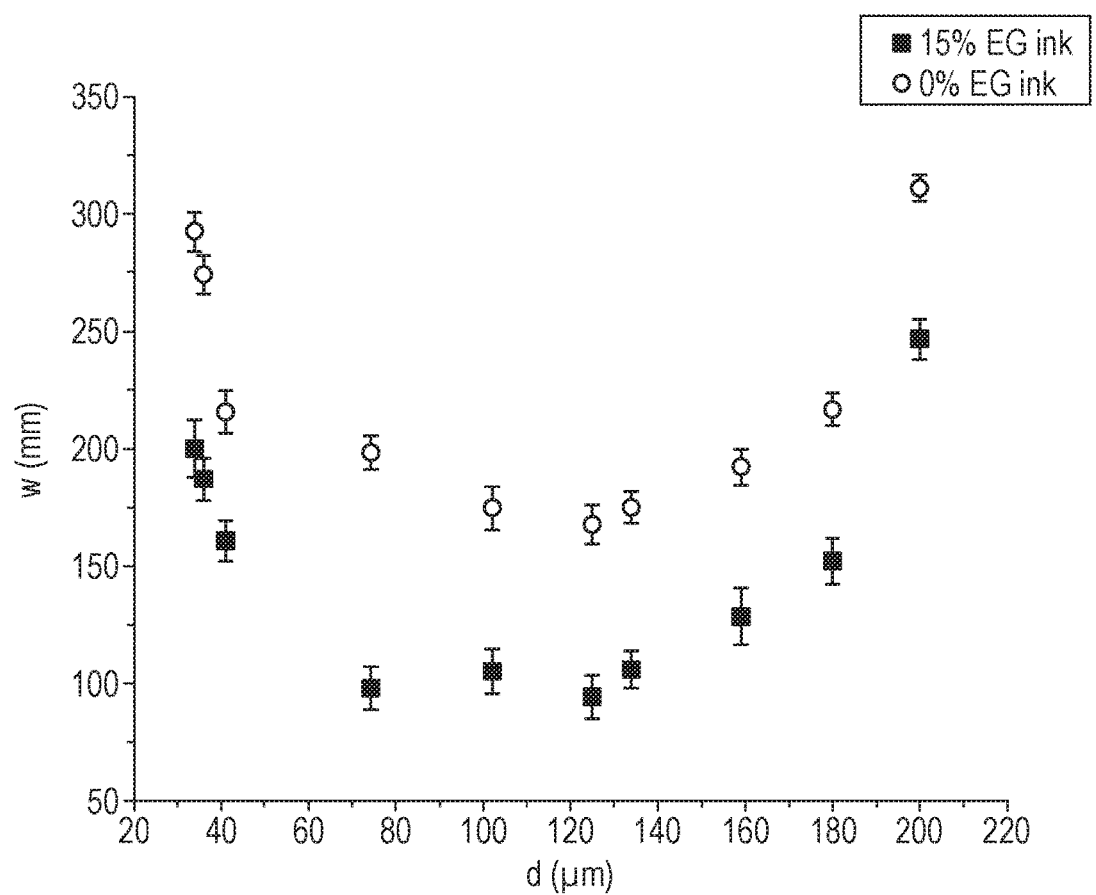

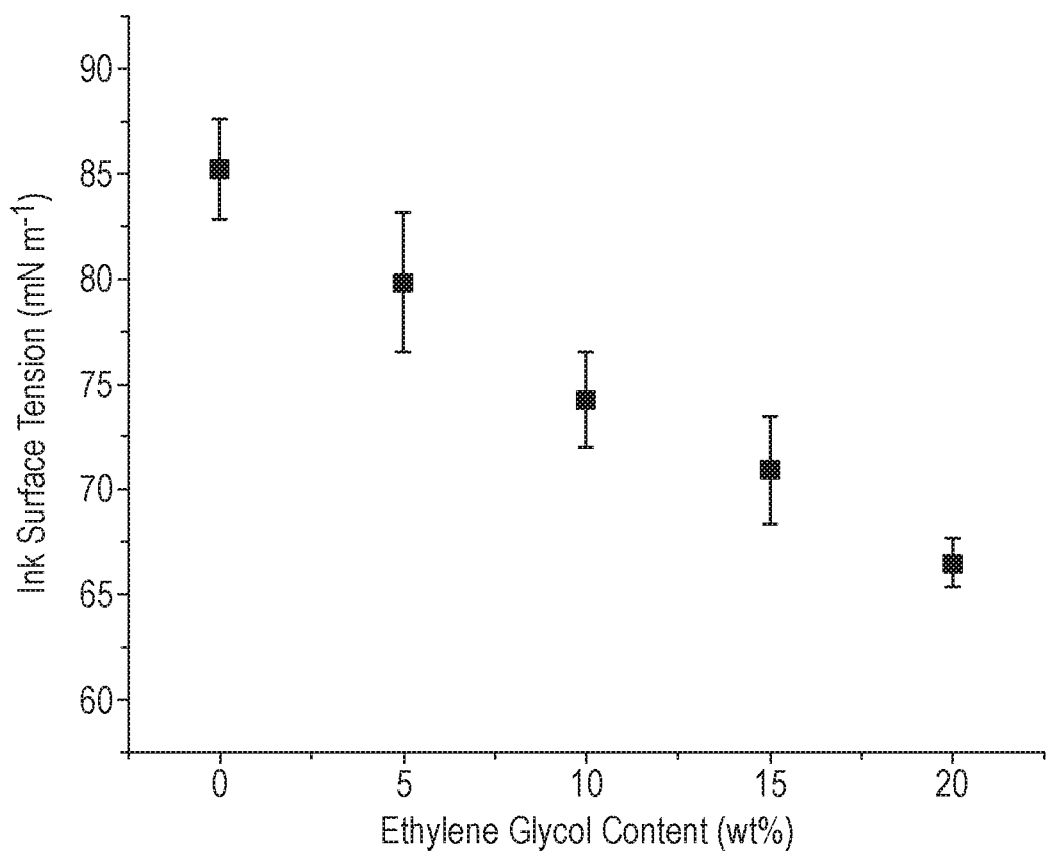

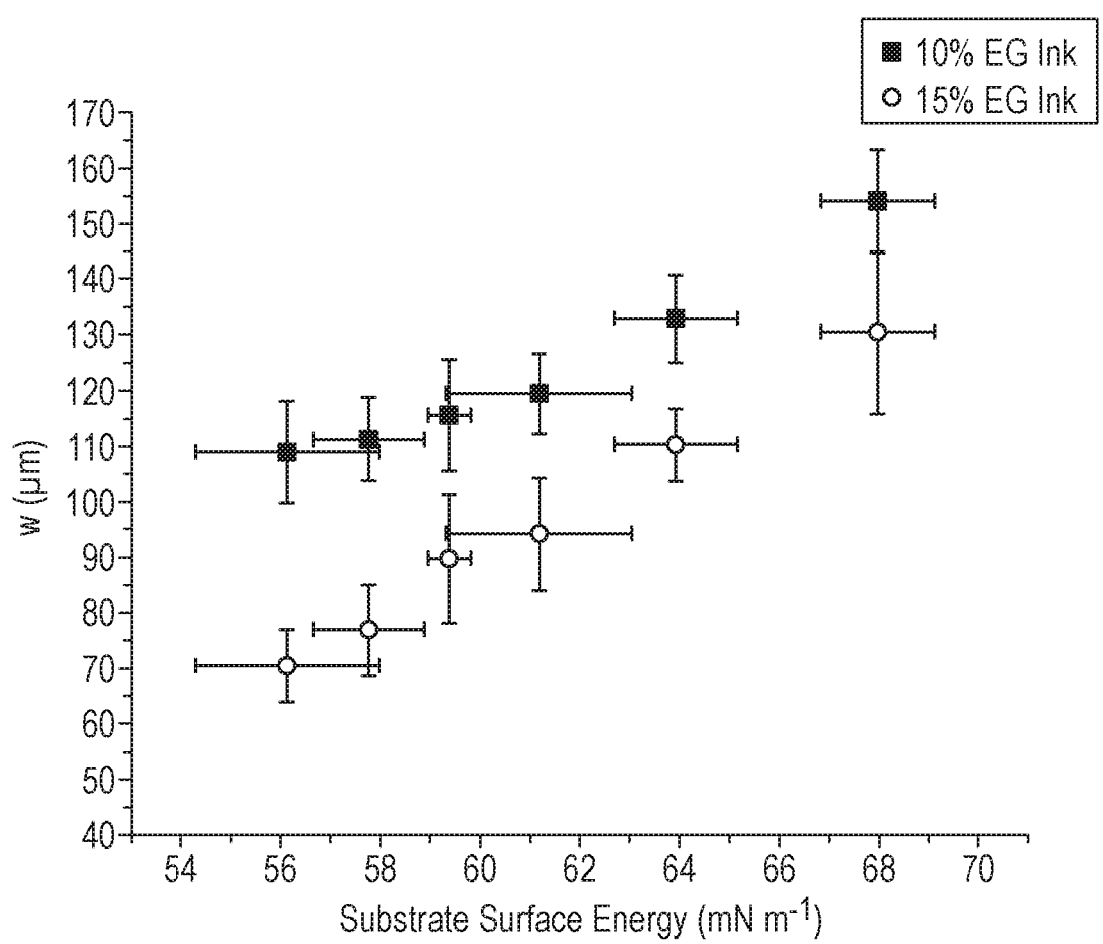

SOLVO-DYNAMIC PRINTING

CROSS-REFERENCE TO RELATED APPLICATIONS

This application is the National Stage of International Application No. PCT/GB2018/051753, filed Jun. 22, 2018, which claims priority to GB 1710091.8, filed Jun. 23, 2017, which are entirely incorporated herein by reference.

FIELD OF THE INVENTION

The invention relates to a process for producing a printed article. The invention also relates to a printed article produced by the process. The invention further provides an apparatus for producing a printed article according to the process of the invention. Also described herein is the use of the apparatus of the invention to perform the process of the invention.

BACKGROUND TO THE INVENTION

The two-dimensional patterning of functional materials on a small scale has become an important aspect of manufacturing technology. Such patterning it is essential in the fabrication of devices like microelectronic integrated circuits, microelectromechanical systems, optoelectronic devices and DNA microassays.

Traditionally, patterning has been done via lithographic techniques which can achieve the deposition of features having resolutions in the nanometer range. However, such techniques are usually complex and require expensive equipment. Moreover, lithographic techniques are low in throughput. As a result, alternative direct additive fabrication techniques like inkjet, flexographic and gravure printing are increasingly used in the field of printed electronics. Such techniques have substantially lower costs and are compatible with large area high throughput processes.

Among these techniques, inkjet printing is the most popular due to its simplicity and low cost. During inkjet, ink droplets are ejected from the printhead onto the desired location on the substrate and therefore do not required the use of masks or templates. It is also a purely additive process, which minimizes material waste. In addition, it is a non-contact printing technique since the printhead is positioned above the substrate. This minimizes substrate damage during the printing, making inkjet printing suitable for printing onto devices with fragile thin film layers. However, the application of inkjet printing is limited by its resolution. Current inkjet printing technology can typically produce features with a resolution of 20-30 µm. It is therefore unsuitable for applications which require feature sizes in the nanometer range.

To improve the resolution of inkjet printing techniques, variations of the technique have been developed. One such variation involves pre-patterning the substrate before it is printed. The substrate may be modified structurally, or modified with chemicals which alter the wetting behaviour of the ink droplets on the pre-patterned parts of the substrate. However, this method requires an additional patterning steps which may involve the use of other patterning techniques, adding complexity to the overall process.

Another variation is electrodynamic inkjet printing wherein the inkjet printing technique is modified to incorporate an electric field applied between the substrate and printhead. The ink forms a sharp Taylor cone at the nozzle when an electric field is applied, allowing very small droplets to be pulled out from the tip of the cone. Electrodynamic inkjet printing has achieved resolutions as low as several microns. However, the addition of the electrical system adds to the complexity of the technique. Moreover, the performance of the technique is limited by the ink, which must have particular electrical properties to be suitable for electrodynamic inkjet printing.

There remains a need for a printing technique which can resolve features in the low micrometre and nanometre range. It is further desirable for such a technique to be simple to perform (for instance requiring few steps and no expensive equipment), and to be generally applicable to a wide range of ink and substrate systems.

SUMMARY OF THE INVENTION

The present invention provides a neat solution to improve the resolution of a printing system, which involves the use of a carrier liquid that is immiscible with the liquid to be deposited during printing. The presence of a carrier liquid around a deposit liquid on a substrate reduces the spreading of the deposit liquid, as illustrated in FIG. 1. The carrier liquid therefore reduces the footprint of the deposit liquid on the substrate, reducing the size of the printed feature, thereby increasing the printing resolution.

Accordingly, the present invention provides a process for producing a printed article, wherein the process comprises:
   passing a deposit liquid through an aperture and passing a carrier liquid through an aperture to form a volume of the deposit liquid in a volume of the carrier liquid on a substrate,
wherein the deposit liquid is immiscible with the carrier liquid.

Where the deposit liquid is provided to the substrate simultaneously with the carrier liquid, initial spreading of the deposit liquid on the substrate is reduced. Additionally, splashing of the deposit liquid (which would increase the spread of the deposit liquid on the substrate) is reduced. These features therefore improve the resolution of a feature printed according to the process of the invention. Accordingly, the invention provides a process comprising passing the deposit liquid through an aperture and passing the carrier liquid through an aperture simultaneously to form said volume of the deposit liquid in said volume of the carrier liquid on a substrate.

The presence of the carrier liquid can additionally be used to improve the resolution of the printing technique by reducing the effective aperture size through which the deposit liquid passes. Thus, in a particularly preferred embodiment, the deposit liquid and the carrier liquid pass through the same aperture.

The invention also provides a printed article obtainable by the process of the invention.

The invention further provides an apparatus for producing a printed article by the process of the invention, wherein the apparatus comprises:
   a first device configured to provide a flow of a deposit liquid through the apparatus;
   a second device configured to provide flow of a carrier liquid through the apparatus;
   a first flow channel for carrying a deposit liquid;
   a second flow channel for carrying a carrier liquid; and
   an aperture for providing liquid to a substrate.

In another aspect, the invention provides a process for producing a printed article wherein the apparatus of the invention is used in the process. The process for producing the printed article may be as further defined anywhere herein, and the apparatus of the invention may be as further defined anywhere herein.

BRIEF DESCRIPTION OF THE FIGURES

FIG. 4(*b*) illustrates the effect of varying the relative feed rates of the carrier liquid and deposit liquid. In each image, the carrier liquid is provided to the flow channel in the upper tube and the deposit liquid (shown in darker grey) is provided to the flow channel in the lower tube. Flows of deposit liquid and carrier liquid are established side-by-side in the tube to the left of each image. In the uppermost image, the feed rates of deposit liquid and carrier liquid are the same ($q_c$:$q_d$=1:1) and the deposit liquid and carrier liquid occupy approximately equal volumes of the flow channel. In the lower two images, the feed rate of the carrier liquid exceeds that of the deposit liquid ($q_c$:$q_d$=1:2 and 1:8) and the deposit liquid occupies a correspondingly smaller fraction of the flow tube, and hence of the aperture at the end of the flow tube.

FIG. 7(*a*) is a photograph of a discontinuous flow regime, and FIG. 7(*b*) is a photograph of a parallel flow regime.

FIG. 12 shows the variation in printed line width (w) with the change in width of the stream of deposit liquid in the channel leading to the aperture (d).

FIG. 13 shows the variation in a deposit liquid's surface tension with the change in ethylene glycol content of the deposit liquid.

FIG. 18 shows variation in printed line width (w) with the change in substrate surface energy.

DETAILED DESCRIPTION OF THE INVENTION

The invention provides a process for producing a printed article, wherein the process comprises:
passing a deposit liquid through an aperture and passing a carrier liquid through an aperture to form a volume of the deposit liquid in a volume of the carrier liquid on a substrate,
wherein the deposit liquid is immiscible with the carrier liquid.

The invention further provides a printed article obtainable by the process of the invention, and an apparatus for producing a printed article according to the method of the invention. Where the apparatus of the invention is used to perform the process of the invention, the deposit liquid, carrier liquid and substrate are as defined in relation to the process of the invention. Various embodiments of the process and the gel network of the invention will be discussed below.

Controlling Wetting Behaviour

The process of the invention involves the formation of a volume of a deposit liquid in a volume of a carrier liquid on a substrate. The deposition of liquids "on" a substrate usually means that the carrier liquid and deposit liquid volumes are formed on top of the substrate, or vertically above the substrate. Typically, the deposit liquid is denser than the carrier liquid, and, as the skilled person will appreciate, this ensures that the deposit liquid will sit underneath the carrier liquid on the substrate. The volume of deposit liquid formed on the substrate therefore typically contacts the substrate and the carrier liquid. It is therefore preferred that the deposit liquid is denser than the carrier liquid.

By "in" a volume of carrier liquid is meant that the carrier liquid overlies the deposit liquid. Typically, therefore, the volume of deposit liquid formed in the volume of carrier liquid is not in contact with the surrounding environment (such as air). The volume of deposit liquid in the volume of carrier liquid typically contacts the substrate and the carrier liquid.

Figure 1:
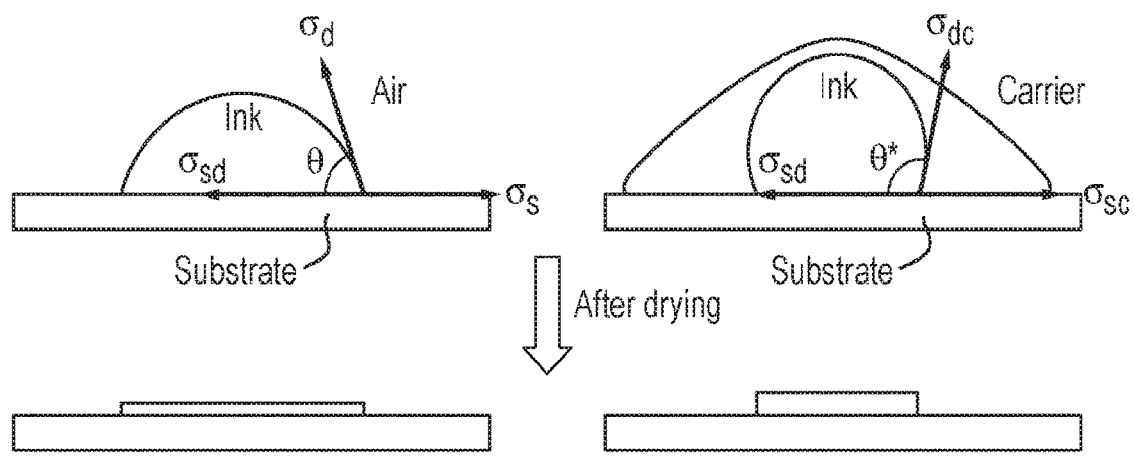
FIG. 1 is a schematic image showing how, in the absence of carrier liquid, the surface energies at the deposit liquid/substrate, substrate/air and deposit liquid/air boundaries determine the contact angle of the deposit liquid with the substrate (top left-hand image). The top right-hand image shows that, in the presence of carrier liquid, the surface energies at the deposit liquid/substrate, substrate/carrier liquid and deposit liquid/carrier liquid boundaries determine the contact angle of the deposit liquid with the substrate. The lower two images show that a smaller contact angle of the deposit liquid with the substrate leads to a smaller area of printed material on the substrate and improved resolution.

FIG. 1 demonstrates how the presence of a carrier liquid can advantageously reduce the spread of a deposit liquid (such as ink) on a substrate and thus improve printing resolution. When a deposit liquid is deposited on a substrate in accordance with the invention, as described above, the spread of that deposit liquid is influenced by three surface energies. These surface energies are also referred to as surface tensions. The three surface energies or surface tensions are:

the energy of the interface between the deposit liquid and the surrounding medium, usually air ($\sigma_d$);
the energy of the interface between the substrate and the surrounding medium, usually air ($\sigma_s$); and
the energy of the interface between the deposit liquid and the substrate ($\sigma_{sd}$).

The system will try to reduce the area of surfaces which have a high surface energy by increasing the area of surfaces which have a low surface energy. For example, if $\sigma_{sd}$ is small and $\sigma_s$ is large, the deposit liquid will tend to wet the substrate and hence to spread out on the substrate, leading to a small equilibrium contact angle ($\theta$).

Inclusion of a carrier liquid changes the surface energies in the system. As the deposit liquid is no longer exposed to the surrounding medium, the surface energy $\sigma_d$ does not affect the wetting of the substrate by the deposit liquid. Instead, the surface energies of the system are:

the energy of the interface between the deposit liquid and the carrier liquid ($\sigma_{dc}$);
the energy of the interface between the substrate and the carrier liquid ($\sigma_{sc}$); and
the energy of the interface between the deposit liquid and the substrate ($\sigma_{sd}$).

In this case, where $\sigma_{sd}$ is small and $\sigma_{sc}$ is large, the deposit liquid will tend to wet the substrate and hence to spread out on the substrate, leading to a small contact angle in carrier liquid ($\theta^*$). However, where $\sigma_{sd}$ is large and $\sigma_{sc}$ is small, the carrier liquid will tend to wet the substrate and the deposit liquid will minimise its spread over the substrate surface and maintain a large equilibrium contact angle in carrier liquid ($\theta^*$).

In a preferred embodiment of the invention, the contact angle ($\theta$) of the deposit liquid is increased in the presence of carrier liquid. Thus, where the process is performed in air, the contact angle ($\theta$) of a deposit liquid is preferably larger for a volume of the deposit liquid in a volume of carrier liquid than for a volume of the deposit liquid in air. Where the process is performed in a medium other than air (for instance inert gas such argon or nitrogen) the contact angle ($\theta$) of the deposit liquid is preferably larger for a volume of the deposit liquid in a volume of carrier liquid than for a volume of the deposit liquid in that medium.

It is preferred that the contact angle in carrier liquid ($\theta^*$) is larger than the contact angle in the medium in which process is performed, usually air ($\theta$). Preferably, therefore, $\theta^* > \theta$.

The manner in which the aforementioned surface energies affect the contact angle of the deposit liquid with the substrate in the absence of carrier liquid are expressed by the Young's equation (Equation 1):

$$\cos\theta = \frac{\sigma_s - \sigma_d}{\sigma_{sd}} \qquad \text{(Equation 1)}$$

In the presence of carrier liquid, the aforementioned surface energies affect the contact angle of the deposit liquid with the substrate in the presence of a carrier liquid are expressed by the following equation (Equation 2):

$$\cos\theta^* = \frac{\sigma_{sc} - \sigma_{sd}}{\sigma_{dc}} \qquad \text{(Equation 2)}$$

And it is therefore preferred that:

$$\cos^{-1}\left(\frac{\sigma_{sc} - \sigma_{sd}}{\sigma_{dc}}\right) > \cos^{-1}\left(\frac{\sigma_{s} - \sigma_{d}}{\sigma_{sd}}\right) \quad \text{(Equation 3)}$$

The skilled person would readily understand how to determine whether any particular combination of carrier liquid, deposit liquid and substrate surface have the desired properties. Surface energies of many liquids at their interface with air are readily available from reference texts.

Figure 2:
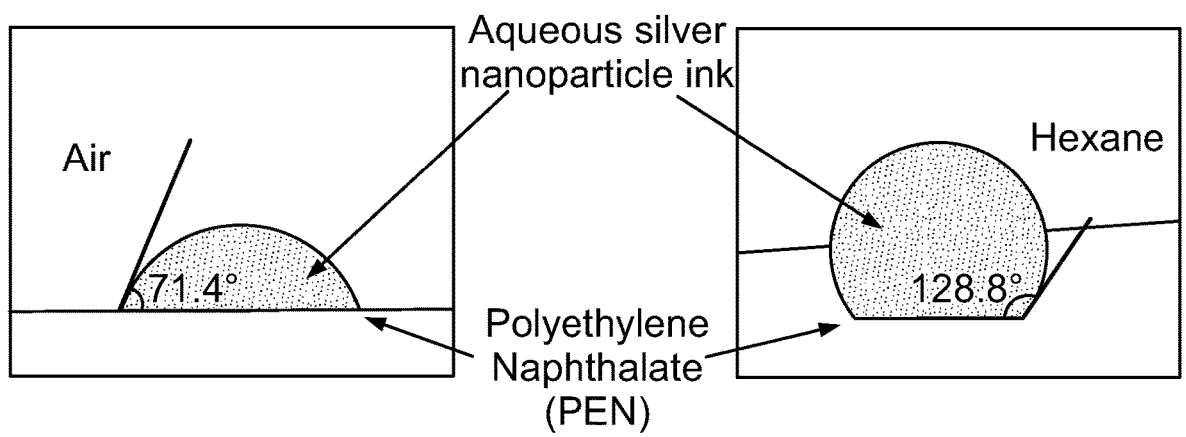
FIG. 2 illustrates the contact angle of an aqueous ink with a polyethylene naphthalate substrate in air and in hexane.
Figure 3:
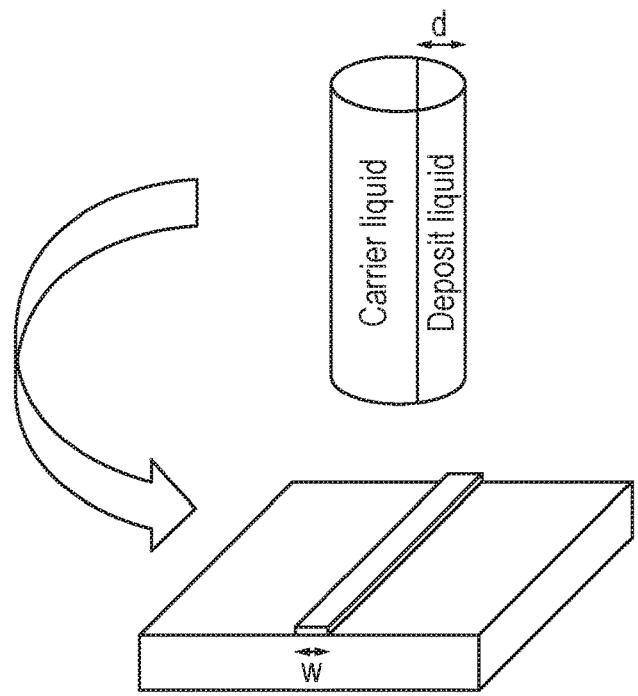
FIG. 3 shows the effective narrowing of an aperture to deposit liquid occurring where a carrier liquid and deposit liquid pass through an aperture simultaneously. The width of the deposit liquid passing through the aperture (d) is narrower than the total width of the aperture due to the presence of carrier liquid in the aperture. This narrows the deposit (w) on the substrate.

Furthermore, the effect of the carrier liquid may simply be observed. A suitable procedure for this observation is illustrated in FIG. 2. A photograph is taken of the deposit liquid (aqueous silver nanoparticle ink) on the substrate of interest (polyethylene naphthalate) in the medium in which the process is to be performed (air). The equilibrium contact angle of the deposit liquid in said medium, $\theta$, is measured (71.4°). A carrier solvent (hexane) is then added and a further photograph is taken. The contact angle of the deposit liquid in carrier liquid, $\theta^*$, is measured (128.8°). $\theta$ and $\theta^*$ are compared to see if $\theta^*$ is larger than $\theta$. Thus, a combination of carrier liquid, deposit liquid and substrate surface wherein $\theta^*$ is larger than $\theta$ may readily be found by simple trial and error. Suitable combinations are readily found involving an aqueous deposit liquid and an organic carrier liquid.

In some embodiments of the invention, the contact angle of the deposit liquid with the substrate in the carrier liquid ($\theta^*$) is approximately equal to the contact angle of the deposit liquid with the substrate in the medium in which the process is performed, typically air ($\theta$). Typically, $\theta^*$ is equal to or greater than $\theta$. In some embodiments, $\theta^*$ is at least 5° greater than $\theta$. For example, $\theta^*$ may be at least 10°, 25° or 50° greater than $\theta$.

It is important to note that the effect on the contact angle is not the only means by which the carrier liquid can improve printing resolution. Therefore, while it is preferable that $\theta^* > \theta$, it is possible for the carrier liquid to improve printing resolution when $\theta^*$ is approximately equal to $\theta$, and even when $\theta^* < \theta$, as will be discussed below. It is therefore also envisaged that in some embodiments of the invention, $\theta^*$ is approximately equal to $\theta$, or $\theta^* < \theta$.

Process of the Invention

The process of the invention comprises passing a deposit liquid through an aperture and passing a carrier liquid through an aperture to form a volume of the deposit liquid in a volume of the carrier liquid on a substrate.

In the process of the invention, an aperture is an opening through which liquid can pass. For instance, the aperture may be an outlet from a flow tube. Other examples of suitable apertures include the end of a tube, a nozzle, or a needle.

During the process of the invention, liquids are passed through an aperture. This means that the liquid is transferred from an initial location, such as a reservoir, to the substrate through an aperture. Liquid takes on the shape of an aperture through which it passes. Accordingly, the effect of passing the liquid through an aperture is that the amount of liquid passing onto the substrate is limited by the dimensions of the aperture.

Usually, the process comprises passing a deposit liquid through an aperture and passing a carrier liquid through an aperture directly onto a substrate. A liquid (whether it is deposit liquid, carrier liquid or both) passing onto a substrate through an aperture initially has the dimensions of the aperture. It is therefore often possible to reduce at least one dimension of the volume of deposit liquid formed on the substrate by reducing the width of the aperture through which it is passed onto the substrate. If the aperture through which the deposit liquid passes becomes too small, it is difficult for the deposit liquid to pass therethrough. On the other hand, if the aperture is too large, the volume of deposit liquid passed onto the substrate will be large and the resolution of the printing technique will therefore be poor.

Typically, therefore, the deposit liquid is passed through an aperture having a diameter of from 1 to 500 µm, preferably 10 to 300 µm, more preferably 20 to 200 µm. By "diameter" herein is meant the largest distance across the aperture's cross section. As the skilled person will appreciate, the shape of the aperture's cross section is not particularly limited. An aperture may have a circular cross-section, for instance, with a diameter of, say 50 µm. Alternatively, an aperture may have a square cross section, which may for example have sides of 50 µm. In that case it will have a diameter of approximately 71 µm (across the diagonal of the square, from vertex to opposite vertex).

Where the carrier liquid passes through a different aperture from the deposit liquid, the diameter of that aperture is not particularly limited. The diameter may be the same as, larger than or smaller than that of the aperture through which the deposit liquid passes. Typically, the diameter is the same as or larger than that of the aperture through which the deposit liquid passes. Preferably, where the carrier liquid passes through a different aperture to the deposit liquid the diameter of that aperture is larger than that of the aperture through which the deposit liquid passes. For example, the diameter of the aperture through which the carrier liquid passes may be from 1 to 2000 µm, preferably 10 to 500 µm, more preferably 20 to 300 µm.

It is important to note that the dimensions (e.g. diameter) of the aperture through which the deposit liquid passes may not correspond to the resolution of the printed article. Other factors influence the dimensions of the volume of deposit liquid on the substrate. For instance, the deposit liquid may splash or spread on the substrate. As discussed above, the presence of a carrier liquid around a volume of deposit liquid on a substrate can reduce spreading of the deposit liquid by increasing $\theta^*$.

In one embodiment of the process of the invention, the process comprises:
passing a deposit liquid through an aperture to form a volume of the deposit liquid on a substrate; and
passing a carrier liquid through an aperture to form a volume of carrier liquid around the volume of the deposit liquid on the substrate.

In preferred embodiments, the process comprises passing the deposit liquid through an aperture and passing the carrier liquid through an aperture simultaneously to form said volume of the deposit liquid in said volume of the carrier liquid on a substrate. There are multiple advantages to this embodiment of the invention. Passing the carrier liquid and deposit liquid simultaneously onto a substrate can reduce initial spreading of the deposit liquid on the substrate. This minimises the spread of material in the deposit liquid across the substrate. This is particularly important where the carrier liquid increases the contact angle of the deposit liquid with the substrate. Providing carrier liquid and deposit liquid simultaneously can reduce or prevent the distribution of the deposit liquid over the substrate and improve the resolution of the printing process. Additionally, passing the carrier liquid and deposit liquid simultaneously onto a substrate can reduce splashing of the deposit liquid. Again, this improves the resolution of the printing technique.

In some embodiments of the process of the invention, the deposit liquid and the carrier liquid pass through the same aperture. The use of a single aperture to provide both a volume of deposit liquid and the surrounding volume of carrier liquid requires an advantageously simple apparatus.

Where the deposit liquid and the carrier liquid pass through the same aperture in the process of the invention, the liquids may be provided one after the other. For instance, in some embodiments the process may comprise passing a volume of deposit liquid through the aperture and subsequently passing a volume of carrier liquid through the aperture to form the volume of deposit liquid in the volume of carrier liquid on the substrate. Alternatively, the process may comprise passing a volume of carrier liquid through the aperture and subsequently passing a volume of deposit liquid through the aperture.

Generally the process comprises passing the deposit liquid and the carrier liquid through the same aperture simultaneously to form said volume of the deposit liquid in said volume of the carrier liquid on the substrate. In this aspect of the invention, it is ensured that the volume of deposit liquid is immediately formed in the volume of carrier liquid. Thus initial spreading of the deposit liquid (as may happen in the absence of carrier liquid) is prevented. No additional positioning is needed to ensure that the volume of deposit liquid sits within the volume of carrier liquid on the substrate.

Particularly advantageously in this embodiment, the presence of the carrier liquid may be used to narrow the effective size of the aperture through which the deposit liquid can pass, thus improving the printing resolution further. This aspect of the invention is described in more detail hereafter.

In order to pass the deposit liquid and the carrier liquid through the same aperture, it is possible to provide deposit liquid and carrier liquid directly to the aperture. Alternatively, the deposit liquid and carrier liquid may be provided to a flow channel, which flow channel leads to the aperture. Accordingly, in some embodiments the process comprises providing the deposit liquid and the carrier liquid together in a flow channel to the same aperture. For example, the process of the invention may comprise:

providing a deposit liquid to a flow channel;
providing a carrier liquid to the flow channel; and
passing the deposit liquid and the carrier liquid from the flow channel through the same aperture simultaneously to form a volume of the deposit liquid in a volume of the carrier liquid on a substrate.

The flow channel may be any channel suitable for carrying the deposit liquid and the carrier liquid. For example, the flow channel may comprise a microchannel or a tube. Typically, the diameter of the flow channel is at least as large as the aperture to which it leads.

Effective Aperture Size

Liquid flowing out of an aperture in the process of the invention usually occupies the whole of the aperture. Accordingly, on passing through the aperture the liquid has a cross-sectional area A where A is equal to the cross-sectional area of the diameter. However, where the carrier liquid and the deposit liquid are provided to the substrate via the same aperture simultaneously, the carrier liquid occupies at least part of the cross-sectional area of the aperture (A). The area of the aperture available for the outflow of deposit liquid is thus reduced to A', where A' is less than A. In other words, the carrier liquid reduces the effective aperture size seen by the deposit liquid.

The reduction in the cross-sectional area of the deposit liquid passing through the aperture causes a narrower stream of the deposit liquid to pass onto the substrate. This improves the resolution of the printing process by allowing the deposit of finer features, and so is highly advantageous.

In some preferred embodiments of the process of the invention, the process comprises:
passing the deposit liquid and the carrier liquid through the same aperture simultaneously,
the aperture having a cross-sectional area A, and
the deposit liquid having a cross-sectional area A' as it passes through the aperture, A' being smaller than A,
to form said volume of the deposit liquid in said volume of the carrier liquid on the substrate.

Narrowing of an effective aperture size available to a deposit liquid is illustrated in FIG. 3. As is evident from FIG. 3, the greater the proportion of the aperture occupied by the carrier liquid, the narrower the flow of deposit liquid through the aperture. Furthermore, there is some correlation between the dimensions of the flow of deposit liquid passing through the aperture (width indicated by d in FIG. 3) and the dimensions of the feature printed on the printed article thereby (indicated by w in FIG. 3). In general, therefore, the smaller A' is compared to A, the higher the resolution of the printing process.

There is no particular limit on the size of A' in relation to A. A' is greater than 0% and less than 100% of A. Typically, A' is 95% of A or less, for example from 5 to 95% of A or from 10 to 90% of A. It is preferable that A' is somewhat smaller than A to increase the resolution of the printing process. Usually, therefore, A' is 80% of A or less, preferably 60% of A or less. On the other hand, when A' is very much smaller than A, the flow of deposit liquid passing through the aperture may become unstable or irregular. Usually, therefore, A' is at least 1% of A. For example, A' may be from 5% to 80% of A.

The reduction in effective aperture size is a result of the shear forces which the two liquids exert onto each other. The shear force exerted by the carrier solvent stream on the deposit liquid stream increases and deforms the deposit liquid stream to flow within a narrower region. The deformation of the deposit liquid stream can be conveniently achieved in a flow channel, such as a flow channel leading to an aperture.

Providing the Liquids

In the process of the invention, a deposit liquid is provided to an aperture and a carrier liquid is provided to an aperture which may be the same or different. Different methods are available by which a deposit liquid and/or a carrier liquid may be caused to pass through an aperture in the process of the invention. In some embodiments, the process of passing a liquid through an aperture may comprise allowing a liquid to pass through the aperture. For instance, a liquid may be allowed to fall through an aperture under gravity.

Typically, in the process of the invention, passing a liquid through an aperture comprises impelling the liquid to pass through the aperture. It is preferred that the deposit liquid and/or the carrier liquid are actively passed through the apertures under some kind of impetus as this allows the rate at which liquids are provided to the aperture, and hence to the substrate, to be controlled. This in turn allows a measure of control over the resolution of the printing process.

Thus, in some embodiments of the process of the invention, the process comprises providing the deposit liquid at a feed rate $q_d$ and providing the carrier liquid at a feed rate $q_c$. By "feed rate" is meant a volume of liquid provided per unit of time.

The feed rate is the rate at which liquid is provided from a source (such as a pump). Where the carrier liquid and the deposit liquid pass through separate apertures to reach the substrate, the feed rates $q_c$ and $q_d$ are usually equal to the rates at which the carrier liquid and the deposit liquid pass through the respective apertures. However, complications in flow rates arise where two or more liquids pass through the same aperture or the same flow channel. Thus, where the deposit liquid and the carrier liquid pass through the same aperture to reach the substrate, $q_c$ and $q_d$ may not be equal to the rates at which the deposit liquid and the carrier liquid pass through that aperture. In that case, $q_c$ and $q_d$ correspond to the flow rates of the carrier liquid and deposit liquid measured before the carrier liquid and deposit liquid meet. For instance, if the deposit liquid and carrier liquid meet in a flow channel before passing through the aperture, $q_c$ and $q_d$ may be measured before the carrier liquid and deposit liquid enter that flow channel.

The feed rates of the deposit liquid and the carrier liquid are not particularly limited. However, the feed rate of the carrier liquid ($q_c$) is typically at least as large as the feed rate of the deposit liquid ($q_d$). Additionally, larger feed rates are typically required to feed larger apertures.

In some embodiments, the feed rate of the deposit liquid ($q_d$) is at least 1 μl/hr. In some embodiments, $q_d$ is less than 500 μl/hr. For example, $q_d$ may be from 5 μl/hr to 200 μl/hr or from 20 μl/hr to 100 μl/hr.

In some embodiments, the feed rate of the carrier liquid ($q_c$) is at least 1 μl/hr. In some embodiments, $q_c$ is less than 12500 μl/hr. For example, $q_c$ may be from 5 μl/hr to 5000 μl/hr or from 20 μl/hr to 2500 μl/hr.

In some embodiments, both $q_d$ and $q_c$ are at least 1 μl/hr. In some embodiments, $q_d$ is less than 500 μl/hr and $q_c$ is less than 12500 μl/hr. For example, $q_d$ may be from 5 μl/hr to 200 μl/hr and $q_c$ may be from 5 μl/hr to 5000 μl/hr or $q_d$ may be from 20 μl/hr to 100 μl/hr and $q_c$ may be from 20 μl/hr to 2500 μl/hr.

In some embodiments, the feed rate of the carrier liquid is steady. For example, $q_c$ may not vary by more than 10% over a period of at least 30 seconds, or at least 2 minutes, or at least ten minutes, or at least an hour. In some embodiments, the feed rate of the deposit liquid is steady. For example, $q_d$ may not vary by more than 10% over a period of at least 30 seconds, or at least 2 minutes, or at least ten minutes, or at least an hour. In a particular embodiment, the feed rates of both the carrier liquid and the deposit liquid are steady. In this embodiment, $q_c$ and $q_d$ typically do not vary by more than 10% over a period of at least 30 seconds, or at least 2 minutes, or at least ten minutes, or at least an hour. Embodiments of the process wherein the feed rate of the deposit liquid are steady are particularly well-suited to printing elongated features such as lines.

In some embodiments, the feed rate of the deposit liquid is not steady. For example, $q_d$ may change by at least 10% over a period of up to an hour, for instance up to ten minutes, or up to 2 minutes, or up to 30 seconds. In some embodiments, $q_d$ may change by at least 50% over a period of up to an hour, for instance up to ten minutes, or up to 2 minutes, or up to 30 seconds. In some embodiments, $q_d$ may fall to zero and rise above zero over a period of up to an hour, for instance up to ten minutes, or up to 2 minutes, or up to 30 seconds. The embodiments wherein the feed rate drops to zero once or more may be described as a involving a discontinuous feed rate.

Where $q_d$ is not steady or discontinuous, $q_c$ may also be discontinuous or not steady. Alternatively, where $q_d$ is not steady or discontinuous, $q_c$ may be steady. Where $q_c$ is not steady or discontinuous, $q_c$ may change by at least 10% over a period of up to an hour, for instance up to ten minutes, or up to 2 minutes, or up to 30 seconds. In some embodiments, $q_c$ may change by at least 50% over a period of up to an hour, for instance up to ten minutes, or up to 2 minutes, or up to 30 seconds. In some embodiments, $q_c$ may fall to zero and rise above zero over a period of up to an hour, for instance up to ten minutes, or up to 2 minutes, or up to 30 seconds.

Embodiments of the invention wherein $q_d$ (an also optionally $q_c$) are not steady or discontinuous are particularly suited for printing features of varying sizes or for printing a series of discontinuous features on a printed article. Typically, a discontinuous feed rate $q_d$ will lead to the printing of discontinuous features on the printed article.

Varying the feed rates $q_c$ and $q_d$ can cause variation in the output of deposit liquid from the aperture or apertures. Increasing $q_d$ increases the volume of deposit liquid formed on the substrate by the process of the invention. Decreasing $q_d$ decreases the volume of deposit liquid formed by the process on the substrate. Allowing $q_d$ to fall to zero can cause discontinuous volumes of deposit liquid to form on the substrate. Thus, in some embodiments of the invention, the process comprises controlling $q_c$ and/or $q_d$ to control the size of the said volume of the deposit liquid on the substrate. In some embodiments of the invention, the process comprises controlling $q_c$ and/or $q_d$ to control the shape of the said volume of the deposit liquid on the substrate.

Figure 4A:
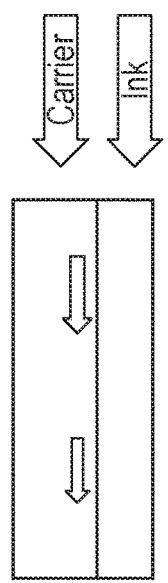
FIG. 4(*a*) shows a schematic view of a carrier liquid and a deposit liquid (ink) passing simultaneously through a flow channel leading to an aperture.
Figure 4B:
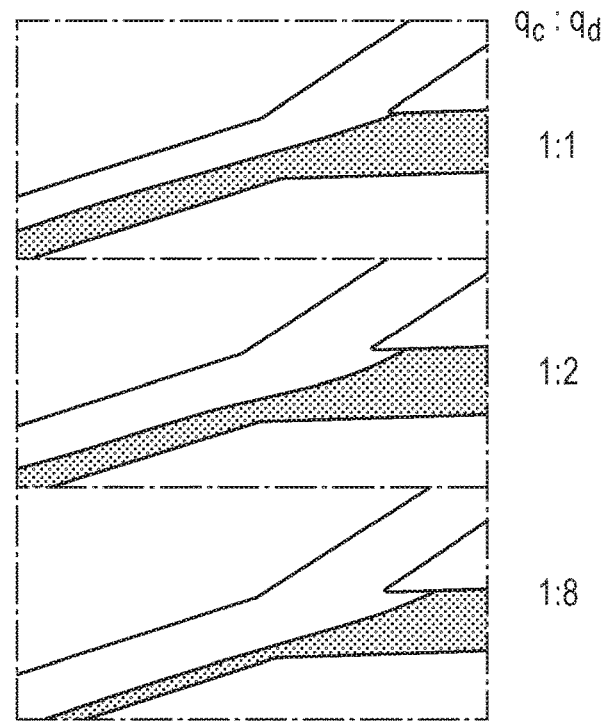
Figure 5A:
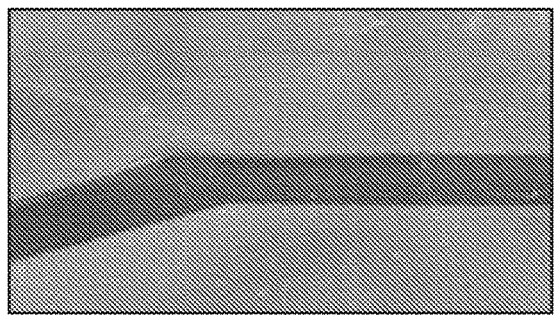
FIG. 5 contains photographic images of the effect of increasing $q_c$ relative to $q_d$. Each image in FIG. 5 is a photograph of a microfluidic chip containing a Y-junction. Carrier liquid is fed into the Y junction from the upper of the two flow channels at the left of each image. Deposit liquid is fed into the Y junction from the lower of the two flow channels at the left of each image. Both deposit liquid and carrier liquid flow from the Y-junction through the flow tube to the right of each image. The deposit liquid is coloured yellow and the carrier liquid is colourless. The ratio $q_c$/$q_d$ in each image is (a) 1, (b) 2, (c) 3, (d) 5 and (e) 8. The deposit liquid occupies a smaller and smaller volume in the shared flow channel as $q_c$/$q_d$ increases.
Figure 5B:
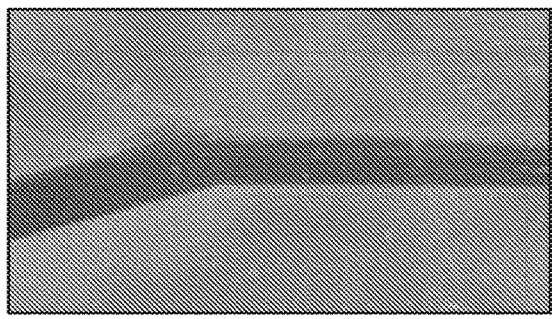
Figure 5C:
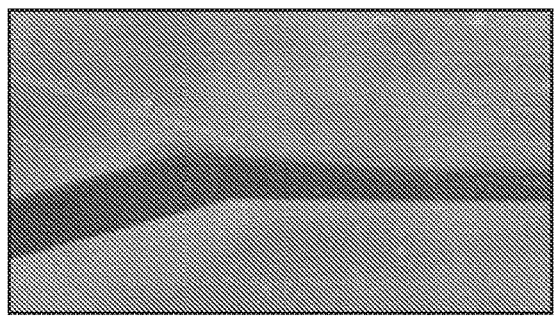
Figure 5D:
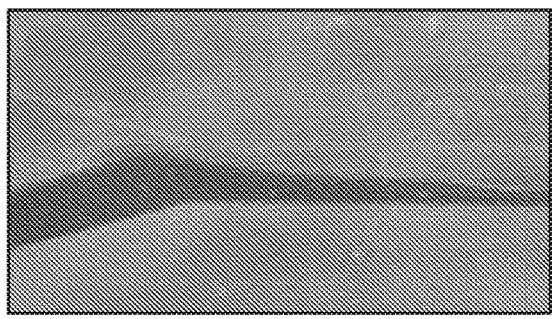
Figure 5E:
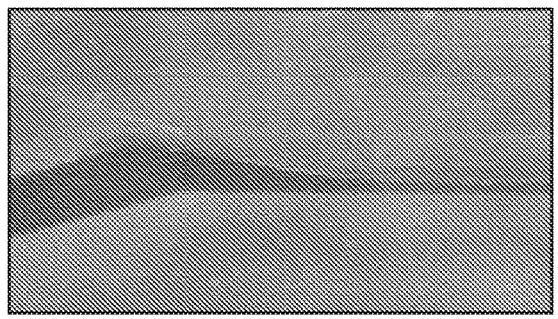

The size and shape of the volume of the deposit liquid on the substrate can also be influenced by controlling the ratio $q_c/q_d$. This is particularly relevant to embodiments of the process wherein the deposit liquid and the carrier liquid pass through the same aperture simultaneously. As was explained above, where the deposit liquid and the carrier liquid pass through the same aperture simultaneously the carrier liquid can reduce the effective size of the aperture seen by the deposit liquid. The higher $q_c$ is in relation to $q_d$, the more carrier passes through the aperture compared to the amount of deposit liquid passing through the aperture. Thus, where a stream of deposit liquid and a stream of carrier liquid pass simultaneously through the same aperture, the higher $q_c$ is in relation to $q_d$ the smaller A' is compared to A. Increasing $q_c/q_d$ can therefore narrow the volume of deposit liquid formed on the substrate, as illustrated in FIGS. 4 to 6.

Therefore, in some embodiments of the invention, the process comprises controlling the ratio $q_c/q_d$ to control the shape of the said volume of the deposit liquid on the substrate.

Increasing $q_c$ compared to $q_d$ favours a smaller A' and higher resolution. However, where $q_c$ is too large compared to $q_d$, disadvantages may arise. For instance, the flow of deposit liquid may become unstable. Where the flow of carrier liquid through the aperture is excessively large, the flow of deposit liquid through the same aperture may be suppressed entirely. The skilled person would readily be able to establish suitable values of $q_d$ and $q_c$ simply by observing the volume or volumes of deposit liquid formed on the substrate.

In the process of the invention, the ratio $q_c/q_d$ must be greater than zero. Generally, $q_c/q_d$ exceeds 0.1. Typically, in the process of the invention, the ratio $q_c/q_d$ is at least 1. Preferably, the ratio $q_c/q_d$ is greater than 1, e.g. from 2 to 25. For instance, the ratio $q_c/q_d$ may be from 2 to 10.

In order to ensure that the desired feed rates are achieved, in some embodiments the deposit liquid and the carrier liquid are pumped towards the one or more apertures. Therefore, in some embodiments of the process of the invention, providing the deposit liquid comprises pumping the deposit liquid at a feed rate $q_d$, and/or providing the carrier liquid comprises pumping the carrier liquid at a feed rate $q_c$.

The deposit liquid and/or carrier liquid may be pumped directly to the apertures through which they are intended to pass. In embodiments of the invention where a flow of deposit liquid and/or carrier liquid is established in a flow tube prior to passing through the aperture, the liquid may be pumped to that flow tube instead. In some embodiments of the process of the invention, the deposit liquid and carrier liquid may be pumped through one or more flow channels to reach an aperture.

Pumping a liquid usually comprises providing the said liquid using a pump. A pump used in the process of the invention is not particularly limited. Any suitable pumping system or pump which can create a flow of liquid may be used. For example, providing the deposit liquid and/or the carrier liquid may involve pressurising a reservoir of the deposit liquid and/or the carrier liquid and hence forcing the said liquid(s) through an aperture or apertures.

Examples of suitable pumps include peristaltic pumps or syringe pumps. Accordingly, in some embodiments of the process of the invention the deposit liquid and/or the carrier liquid are provided by a peristaltic pump or a syringe pump.

In some embodiments of the process of the invention, the deposit liquid may be provided by a pump. In other embodiments of the invention, the carrier liquid may be provided by a pump. Generally, both the deposit liquid and the carrier liquid are provided by a pump. Where both the deposit liquid and the carrier liquid are provided by a pump, both liquids may be provided by the same pump. More typically, each of the deposit liquid and the carrier liquid are provided by different pumps.

In order to make use of the advantageous effect whereby the carrier liquid is used to reduce A' compared to A, it is therefore preferred that the process of the invention comprises passing the deposit liquid and the carrier liquid through the same aperture simultaneously. To produce a stable flow of deposit liquid and carrier liquid through the aperture with a small A', it is preferred that $q_c$ is at least as large as $q_d$. It is also preferred that $q_c$ is not so large that the flow of deposit liquid through the aperture is unstable. Accordingly, in a preferred embodiment of the invention, the process comprises:

- providing the deposit liquid at a feed rate $q_d$ and providing the carrier liquid at a feed rate $q_c$, wherein the ratio $q_c$:$q_d$ is from 2:1 to 25:1;
- passing the deposit liquid and the carrier liquid through the same aperture simultaneously to form said volume of the deposit liquid in said volume of the carrier liquid on the substrate; and
- removing the volume of the carrier liquid from around the deposit liquid.

Where the feed rates $q_c$ and/or $q_d$ are controlled, $q_c$ and/or $q_d$ may be controlled by a flow controller. For instance, $q_c$ and/or $q_d$ may be varied in time by a computer programme configured to control a flow controller.

Flow Rate of Liquids onto the Substrate

The flow rate of carrier liquid through an aperture and onto a substrate is referred to herein as $f_c$ and the flow rate of a deposit liquid through an aperture onto a substrate is referred to herein as $f_d$. Therefore, in the process of the invention, the deposit liquid flows through an aperture at a flow rate $f_d$ and the carrier liquid flows through an aperture at a flow rate $f_c$. These apertures may be the same or different. Typically, the deposit liquid and the carrier liquid flow through the same aperture.

As was mentioned above, the feed rates at which deposit liquid and carrier liquid are provided in the process of the invention may not correspond to the flow rates of deposit and carrier liquid onto the substrate. In particular, flow rates may be altered where two or more liquids flow through the same space such as an aperture or a flow channel. Thus, $f_c$ may or may not equal $q_c$, and $f_d$ may or may not equal $q_d$.

Nonetheless, $f_c$ and $f_d$ are determined by $q_c$ and $q_d$. Generally, increasing $q_c$ will cause $f_c$ to increase, and increasing $q_d$ will cause $f_d$ to increase. Accordingly, in some embodiments of the invention, $f_c$ and/or $f_d$ are controlled.

In the process of the invention, $f_c/f_d$ must be greater than zero. Generally, $f_c/f_d$ is 0.1 or more. In some embodiments of the invention, $f_c/f_d$ is at least 1. For instance, $f_c$:$f_d$ may be from 2:1 to 25:1.

One particular advantage of controlling $f_c$ and $f_d$ is to avoid splashing. Where the flow rates of carrier liquid and/or deposit liquid out of one or more apertures and onto a substrate are too high, splashing and/or spreading may occur. However, if flow rates are too low, the printing process can become too slow.

In some embodiments, the flow rate of the deposit liquid ($f_d$) is at least 1 μl/hr. In some embodiments, $f_d$ is less than 500 μl/hr. For example, $f_d$ may be from 5 μl/hr to 200 μl/hr or from 20 μl/hr to 100 μl/hr.

In some embodiments, the flow rate of the carrier liquid ($f_c$) is at least 1 μl/hr. In some embodiments, $f_c$ is less than 12500 μl/hr. For example, $f_c$ may be from 5 μl/hr to 5000 μl/hr or from 20 μl/hr to 2500 μl/hr.

In some embodiments, both $f_d$ and $f_c$ are at least 1 μl/hr. In some embodiments, $f_d$ is less than 500 μl/hr and $f_c$ is less than 12500 μl/hr. For example, $f_d$ may be from 5 μl/hr to 200 μl/hr and $f_c$ may be from 5 μl/hr to 5000 μl/hr or $f_d$ may be from 20 μl/hr to 100 μl/hr and $f_c$ may be from 20 μl/hr to 2500 μl/hr.

Continuous Flow of Deposit Liquid

As has been discussed above, the presence of a carrier liquid and a deposit liquid in the same channel or aperture confines the deposit liquid to flow through a smaller space within the channel or aperture. This reduces the stream width of the deposit liquid below the physical limits of the channel or aperture. Therefore, very narrow streams of deposit liquid can be created and deposited during printing. This is referred to as a flow focussing effect. Under such conditions, immiscible liquids flow alongside one another through a flow channel. The flow of two immiscible fluids through a channel or aperture generally fall into two main regimes: laminar flow and turbulent flow. Laminar flow, being the more stable, is generally required in the process of the invention.

In a laminar flow regime, a discontinuous flow regime or a parallel flow may occur. Both may be used in a solvodynamic printing process.

In a discontinuous flow regime, shown in FIG. 7(*a*), the flow of deposit liquid in the flow channel is discontinuous. In a parallel flow regime, as in FIG. 7(*b*), the flow of deposit liquid through the flow channel is continuous.

The flow regime can be characterized by the Capillary number (Ca) which is defined in Equation 4 as:

$$Ca = \frac{\mu V}{\sigma_{dc}} \quad \text{(Equation 4)}$$

where μ is the dynamic viscosity of the deposit liquid, V is the velocity and a is the interfacial energy between the two liquids. The capillary number describes the balance between the viscous forces and interfacial tension of the system. The dynamic viscosity p can be measured using a viscosometer or rheometer. Velocity V may be measured using a flow meter in the channel. Alternatively, V may be calculated from the pump rate and cross-sectional area of the channel.

Viscous forces tend to stabilise a continuous flow of deposit liquid. Consequently, the more viscous the deposit liquid, the more likely it will adopt a parallel flow regime. The interfacial tension competes with the viscous forces within the deposit liquid and tries to break up the stream to form droplets, minimising the interfacial area of the system. Therefore, flow conditions with high capillary numbers (>1) tend to generate parallel flow, while low capillary numbers tend to generate droplet formation. Both regimes can be used to perform solvo-dynamic printing with the droplet formation regime behaving like a droplet-on-demand printing system while the parallel flow regime behaves more like a jetting mode.

Figure 8A:
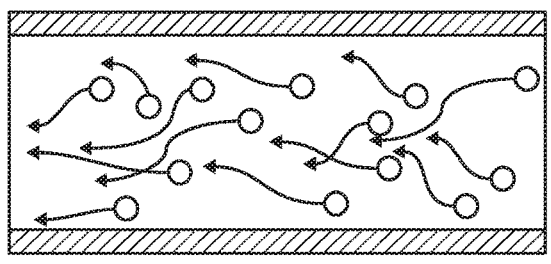
FIG. 8 illustrates the relationship between the flow processes in a flow channel and the occurrence of discontinuous and parallel flow regimes. 8(*a*) and 8(*b*) illustrate the two kinds of flow regime which can occur in a liquid flowing through a flow channel: turbulent flow (as in 8(*a*)) and laminar flow (as in 8(*b*)). The laminar flow regime can be further divided into two kinds of flow regime: discontinuous flow (as shown in 8(*c*)) and parallel flow (shown in 8(*d*)).
Figure 8B:
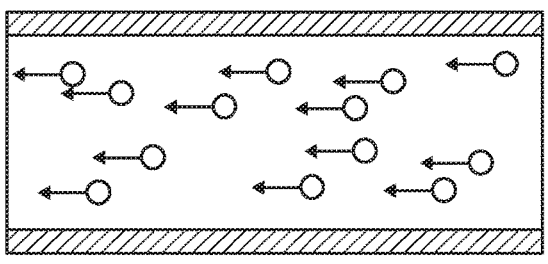
Figure 8C:
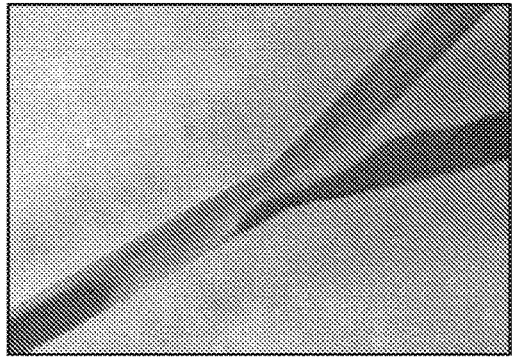
Figure 8D:
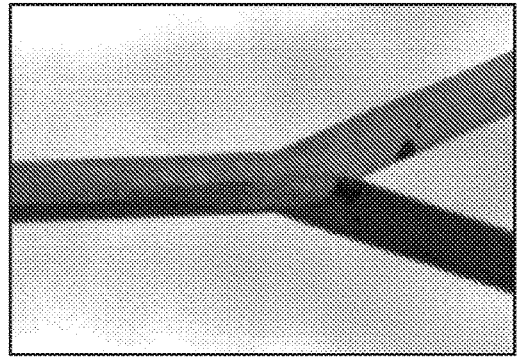

A laminar flow occurs where all regions of the flowing liquid tend to move in the same direction, as illustrated in FIG. 8(b). This reduces the tendency for adjacent parts of the flow (such as the deposit liquid and carrier liquid) to move across or into one another. By contrast, a turbulent flow occurs where all regions of the flowing liquid do not tend to move in the same direction. This is illustrated in FIG. 8(a). In this case, the stream of carrier liquid and the stream of deposit liquid tend to be more irregular and hence laminar flow is preferred in the process of the invention. Accordingly, in a preferred embodiment, the process of the invention comprises passing the deposit liquid through an aperture and the carrier liquid through an aperture in a laminar flow regime. Typically, the process comprises passing the deposit liquid and the carrier liquid through an aperture in a linear flow regime. The process may further comprise initially establishing a laminar flow regime of the deposit liquid and/or the carrier liquid through the one or more apertures.

In the method of the present invention, the existence of a parallel flow is characterised by the continuous flow of deposit liquid and carrier liquid through an aperture. Typically, where a parallel flow is established, both carrier liquid and deposit liquid will flow through the same aperture for at least 5 seconds. For example, both carrier liquid and deposit liquid will flow through the aperture for at least 10 seconds, e.g. at least 1 minute, e.g. at least 10 minutes.

In some embodiments of the invention, the process comprises:
establishing a parallel flow of a deposit liquid and a carrier liquid to an aperture; and
passing the deposit liquid and the carrier liquid through the said aperture simultaneously to form a volume of the deposit liquid in a volume of the carrier liquid on the substrate.

A parallel flow may be conveniently established in a flow channel. Usually, therefore, where the process involves a parallel flow the process comprises:
establishing a parallel flow of a deposit liquid and a carrier liquid in a flow channel leading to an aperture; and
passing the deposit liquid and the carrier liquid through the said aperture simultaneously to form a volume of the deposit liquid in a volume of the carrier liquid on the substrate.

As is evident from Equation 4, the flow regime that is established at an aperture through which deposit and carrier liquid pass depends on their flow rate through the aperture.

These flow rates depend on $q_c$ and $q_d$. Typically, the deposit liquid and carrier liquid approach the aperture in a flow channel and hence the flow regime is established in said flow channel. The flow regime therefore usually depends on the rate at which the deposit liquid and the carrier liquid flow through a flow channel leading to the aperture. These flow rates depend on the feed rates of the deposit liquid and the carrier liquid. Accordingly, where the process of the invention comprises establishing a flow regime (either parallel or discontinuous flow), the process usually comprises controlling $q_c$ and $q_d$.

In some embodiments, of the invention, therefore, the process comprises:
providing the deposit liquid at a feed rate $q_d$ and providing the carrier liquid at a feed rate $q_c$;
establishing a parallel flow of a deposit liquid and a carrier liquid in a flow channel leading to an aperture; and
passing the deposit liquid and the carrier liquid through the said aperture simultaneously to form a volume of the deposit liquid in a volume of the carrier liquid on the substrate.

Usually, the process comprises controlling the feed rate $q_d$ and/or the feed rate $q_c$ to establish the parallel flow.

The process also usually comprises establishing the parallel flow in a flow channel leading to the aperture.

During the outflow of deposit liquid from an aperture, the substrate and aperture are usually moved relative to one another. If the substrate and aperture are not moved relative to one another while the deposit liquid (and usually the carrier liquid) are passed through an aperture onto a substrate, the deposit liquid can pool on the substrate. This causes large volumes of deposit liquid and hence large features with low resolution.

In some embodiments of the invention, the process therefore comprises:
providing the deposit liquid at a feed rate $q_d$ and providing the carrier liquid at a feed rate $q_c$;
establishing a parallel flow of the deposit liquid and the carrier liquid to an aperture; and
passing the deposit liquid and the carrier liquid through the said aperture simultaneously to form said volume of the deposit liquid in said volume of the carrier liquid on the substrate, and simultaneously moving the substrate relative to the aperture.

Typically, the process also comprises removing the volume of the carrier liquid from around the volume of the deposit liquid, as will be discussed in more detail hereafter.

Usually, the process comprises controlling the feed rate $q_d$ and/or the feed rate $q_c$ to establish the parallel flow. The process also usually comprises establishing the parallel flow in a flow channel leading to the aperture.

If a deposit liquid is passed continuously through an aperture (as is the case with a parallel flow) while the substrate and aperture are moved relative to one another, an elongated volume of deposit liquid will be formed on the substrate. Therefore, as will be appreciated by the skilled person, the parallel flow regime is particularly suited to printing elongated, continuous features such as lines. For instance, the parallel flow regime is well-suited to printing the wires in an electronic printed circuit.

Usually, therefore, where the process of the invention comprises establishing a parallel flow of deposit liquid and carrier liquid to the same aperture, the process forms a volume of the deposit liquid in an elongated shape, in a volume of the carrier liquid in an elongated shape, on the substrate. The volumes of deposit liquid and carrier liquid are typically both elongated as both are produced from the same aperture.

Discontinuous Flow of Deposit Liquid

As described above, the process of the invention is suitable for printing elongated features such as lines. This is particularly the case where a continuous flow of deposit liquid is provided to an aperture. A continuous flow of deposit liquid to the substrate through an aperture may be achieved either together with a carrier liquid in the form of a parallel flow, or through a separate aperture to the carrier liquid.

In other embodiments, the process of the invention involves providing a discontinuous flow of deposit liquid to an aperture. This in turn causes a discontinuous flow of deposit liquid to the substrate. This may be desirable where, for instance, it is intended to print a series of separate features onto the substrate.

As is the case where a continuous flow of deposit liquid is provided to an aperture, the substrate and aperture are usually moved relative to one another while a discontinuous flow of deposit liquid is provided to the aperture. If the substrate and aperture are not moved relative to one another while the deposit liquid (and usually the carrier liquid) are passed through an aperture onto a substrate, the deposit liquid can pool on the substrate. For instance, individual volumes of deposit liquid may be deposited on top of one another and may coalesce. This causes large volumes of deposit liquid and hence cause large features with low resolution. Moving the aperture through which the deposit liquid is provided relative to the substrate thus ensures that the discontinuous flow of deposit liquid forms a plurality of volumes of the deposit liquid on the substrate.

In some embodiments, therefore, the process comprises:
providing a discontinuous flow of the deposit liquid to an aperture;
passing the deposit liquid through an aperture and passing a carrier liquid through an aperture onto the substrate; and
moving the substrate relative to the aperture or apertures, to form a plurality of volumes of the deposit liquid in a volume or volumes of the carrier liquid on the substrate.

In embodiments, a discontinuous flow of deposit liquid is provided to an aperture to form a plurality of volumes of deposit liquid which combine on a substrate to form a single volume of deposit liquid. This may be ensured by controlling the movement of the substrate relative to the aperture such that each volume in the said plurality is deposited at a position overlapping that of a previously-deposited volume in the plurality. The volumes of deposit liquid will spread somewhat on the substrate and so each volume may be deposited adjacent to a previously-deposited volume, provided that the droplets thus deposited come into contact on the substrate after deposition. Thus, in some embodiments, the process comprises:
providing a discontinuous flow of the deposit liquid to an aperture;
passing the deposit liquid through an aperture and passing a carrier liquid through an aperture onto the substrate; and
moving the substrate relative to the aperture or apertures, to form a volume of the deposit liquid in a volume or volumes of the carrier liquid on the substrate.

Typically, the process also comprises removing the volume of the carrier liquid from around the volume of the deposit liquid, which will be discussed in more detail hereafter.

In some embodiments, a discontinuous flow of deposit liquid is provided to an aperture to form a plurality of volumes of deposit liquid on a substrate. Subsequently, carrier liquid may be passed to the substrate through the same or a different aperture, to form a plurality of volumes of deposit liquid in one or more volumes of carrier liquid on the substrate. For instance, volumes of carrier liquid and deposit liquid may be deposited alternately. A volume of deposit liquid may be passed through an aperture to a substrate, followed by a volume of carrier liquid thereon, followed by a further volume of deposit liquid, followed by a further volume of carrier liquid thereon, etc. Where the deposit liquid and carrier liquid are passed through the same aperture to the substrate.

As discussed above, in order to minimise splashing and spreading of the deposit liquid, it is preferred that the deposit liquid and carrier liquid are provided to the substrate simultaneously. Thus, in some embodiments the process comprises passing the deposit liquid through an aperture and passing the carrier liquid through an aperture simultaneously to form said plurality of volumes of the deposit liquid in one or more volumes of the carrier liquid on a substrate. That is, it is preferred that each portion of deposit liquid provided to the substrate in a discontinuous flow is accompanied by a carrier liquid. The carrier liquid may be passed to the substrate through the same or a different aperture from that providing the deposit liquid.

Where the process involves passing a carrier liquid and deposit liquid through the same aperture, the process advantageously requires simpler printing equipment. Accordingly, in some embodiments, the deposit liquid and the carrier liquid pass through the same aperture.

As discussed above, if the deposit liquid and carrier liquid pass through the same aperture simultaneously, the effective size of the aperture seen by the deposit liquid is reduced by the carrier liquid. This causes narrower streams or volumes of deposit liquid to pass through the aperture, whose cross-sectional area A' is smaller than the cross-section of the aperture (A). This allows the printing of smaller features, improving the resolution of the printing process. Accordingly, it is preferred that, where the process involves passing a discontinuous flow of deposit liquid through an aperture, the process comprises passing the deposit liquid and the carrier liquid through the same aperture simultaneously to form a plurality of volumes of the deposit liquid in one or more volumes of the carrier liquid on a substrate.

As discussed above, the flow regime that is established at an aperture through which deposit and carrier liquid pass depends on their flow rate through the aperture. This depends on $q_c$ and $q_d$. These feed rates can be controlled to establish a discontinuous flow of deposit liquid to an aperture.

Accordingly, where the process of the invention involves providing a discontinuous flow of a deposit liquid to an aperture, the process typically comprises:
providing the deposit liquid at a feed rate $q_d$ and providing the carrier liquid at a feed rate $q_c$; and
controlling the feed rate $q_d$ and/or the feed rate $q_c$ to establish the discontinuous flow of the deposit liquid.

Where the deposit liquid and carrier liquid are passed to the substrate through different apertures, the discontinuous flow of deposit liquid may be established irrespective of $q_c$. A discontinuous flow of deposit liquid may be established simply by periodically increasing $q_d$ above zero, for example. However, where the deposit liquid and carrier liquid pass to the substrate through the same aperture, establishing a discontinuous flow of deposit liquid may involve controlling both feed rates $q_c$ and $q_d$.

Where the deposit liquid and the carrier liquid pass through the same aperture in the process of the invention, the deposit liquid and carrier liquid usually approach the aperture in a flow channel. A discontinuous flow regime may be established in said flow channel. The flow regime established in a flow channel usually depends on the rate at which the deposit liquid and the carrier liquid flow through a flow channel leading to the aperture. These flow rates depend on the feed rates of the deposit liquid and the carrier liquid. Accordingly, where the process of the invention comprises establishing a discontinuous flow, the process usually comprises controlling $q_c$ and $q_d$.

Control of the feed rates $q_c$ and/or $q_d$ can allow control of more than the flow regime through an aperture. Where a discontinuous flow is established, control of $q_d$ (and $q_c$ if the deposit and carrier liquids pass through the same aperture) can determine the size of each individual portion of deposit liquid (called a droplet) and the frequency with which droplets are passed onto the substrate through the aperture. Control of $q_d$ and optionally $q_c$ can determine the frequency with which $f_d$ drops to zero.

As will be readily appreciated by the skilled person, in a discontinuous flow regime producing droplets the size of each droplet affects the printing resolution. Thus, control of $q_d$ and optionally $q_c$ can determine the printing resolution.

Suitable values of $q_d$ and optionally $q_c$ can readily be determined by trial and error, and observation of the droplet sizes produced on the substrate.

The term "droplet" is used herein to describe a discrete volume of deposit liquid, either on the substrate or not, which can be created by a discontinuous flow regime. Droplets typically occur on a substrate or in a flow channel leading to an aperture. In some embodiments, the process of the invention comprises establishing a discontinuous flow of a deposit liquid to an aperture wherein the said discontinuous flow of the deposit liquid is a flow of droplets of the deposit liquid.

The size of a droplet is not particularly limited. However, droplets tend not to be highly elongated in shape as very elongated portions of deposit liquid lead to continuous flow of a deposit liquid through an aperture. In some embodiments, the length of a droplet (i.e. its largest dimension) is not more than 100 times larger than its width (i.e. its smallest dimension). For example, the length of a droplet may be not more than 50 or not more than 10 times larger than its width.

Where a discontinuous flow regime is established, a flow of droplets is usually established through an aperture. In consequence, a plurality of droplets may be formed on the substrate. Accordingly, in some embodiments of the invention, the process forms a plurality of volumes of the deposit liquid in one or more volumes of carrier liquid on the substrate wherein the said plurality of volumes of the deposit liquid comprises one or more droplets of the deposit liquid.

The said one or more droplets of the deposit liquid on the substrate are not particularly limited in shape. The length of a droplet (i.e. its largest dimension) is typically not more than 100 times larger than its width (i.e. its smallest dimension). For example, the length of a droplet may be not more than 50 or not more than 10 times larger than its width. Thus, in some embodiments, the plurality of volumes of the deposit liquid on the substrate may comprise one or more volumes of the deposit liquid which are elongated in shape.

In some embodiments, the plurality of volumes of the deposit liquid on the substrate may comprise one or more volumes of the deposit liquid which are approximately spherical in shape. For example, the length and width of the said volumes may be approximately equal, e.g. the length of the droplet may not be more than twice its width.

Where the printing process of the invention comprises passing droplets of deposit liquid through an aperture, the droplets may be separated by any material. For instance, the process may comprise passing droplets of deposit liquid separate by regions of gas (e.g. air) through an aperture. In other embodiments, the process may comprise passing droplets of deposit liquid separate by regions of any other liquid immiscible therewith through an aperture. In a preferred embodiment, the process may comprise passing droplets of deposit liquid separate by regions of the liquid through an aperture. This preferred embodiment corresponds to an embodiment wherein the process comprises passing deposit liquid and carrier liquid through the same aperture to the substrate.

It should also be noted that the process may comprise passing a discontinuous flow of carrier liquid through an aperture onto the substrate. Where the printing process of the invention comprises passing droplets of carrier liquid through an aperture, the droplets may be separated by any material. For instance, the process may comprise passing droplets of carrier liquid separate by regions of gas (e.g. air) through an aperture. In other embodiments, the process may comprise passing droplets of carrier liquid separate by regions of any other liquid immiscible therewith through an aperture.

Translation of Aperture(s) and/or Substrate

In many embodiments, the process of the invention comprises moving the substrate relative to the aperture or apertures. In particular, the process usually comprises moving the substrate relative to the aperture through which the deposit liquid passes. This may be achieved by moving the substrate and keeping the aperture stationary, or by moving the aperture and keeping the substrate stationary, or by moving both the aperture and the substrate relative to one another.

The movement of the substrate and aperture(s) relative to one another is usually only done in the XY plane. Where the substrate defines a substantially flat printing surface, that surface defines the XY plane. In moving the substrate and aperture(s) relative to one another, the distance between the aperture(s) and the substrate is usually not changed.

The relative motion of the aperture(s) and the substrate may be continuous or discontinuous. That is, the relative motion of the aperture(s) and the substrate may continue throughout the process, or the relative motion may stop and start. For instance, in the case where a discontinuous flow of deposit liquid is provided to an aperture, the substrate may be moved relative to that aperture while no deposit liquid passes through the aperture. While deposit liquid passes through the aperture, the aperture and substrate may be stationary. In the case where a continuous flow of deposit liquid is provided to an aperture, the substrate may be moved relative to that aperture discontinuously.

While the aperture(s) and the substrate move relative to one another, that motion may occur at a constant rate. Alternatively, the rate may vary. For instance, the aperture(s) and the substrate may move relative to one another at a first speed for a period of time, and may then move relative to one another at a different speed for a subsequent period of time. Similarly, the aperture(s) and the substrate may move relative to one another in a first direction for a period of time, and may then move relative to one another in a different direction for a subsequent period of time.

If the aperture(s) and the substrate move relative to one another while deposit liquid is passing through an aperture onto the substrate, the motion will affect the shape of the volume of deposit liquid formed on the substrate. It may be desirable to use this relative motion to control the printed pattern. Accordingly, in some embodiments of the invention the passing the deposit liquid through an aperture and simultaneously moving the substrate relative to the said aperture or apertures.

Figure 9:
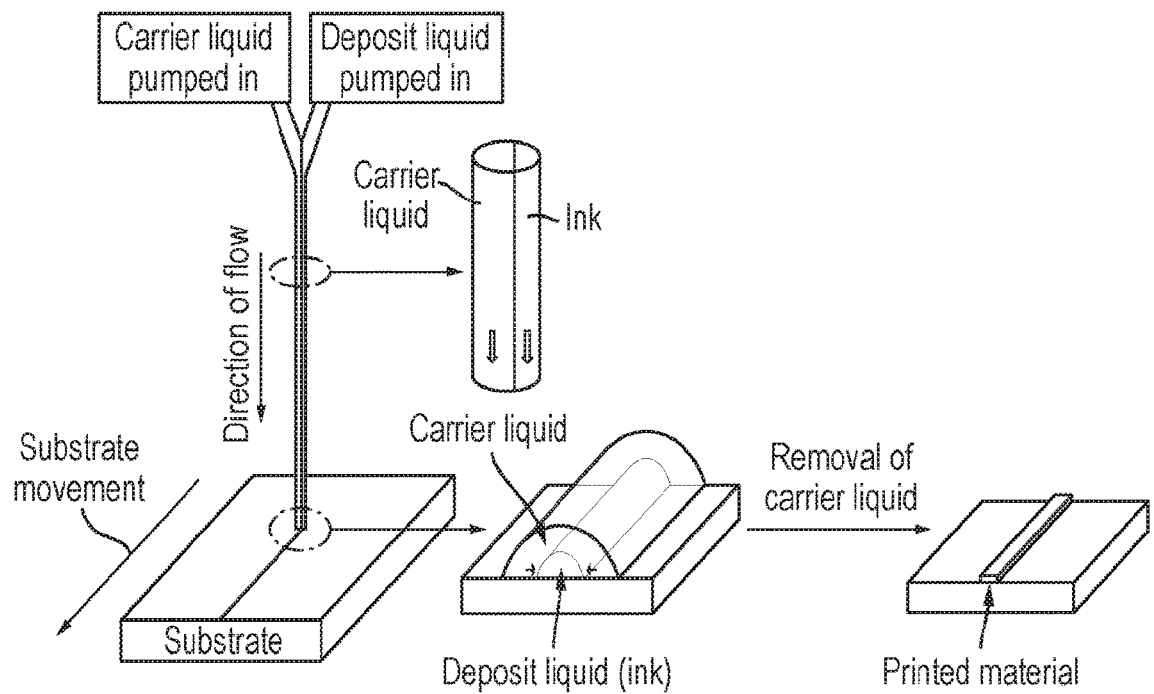
FIG. 9 shows illustrates the translation of a substrate relative to an aperture through which a continuous flow of a deposit liquid (ink) and a carrier liquid pass. This creates an elongated deposit on the substrate.

Typically, the process comprises passing the deposit liquid through an aperture and passing the carrier liquid through an aperture to form the said volume of the deposit liquid in the said volume of the carrier liquid on a substrate, and simultaneously moving the substrate relative to the said aperture or apertures. The movement of the aperture and substrate relative to one another during deposition of a deposit liquid is illustrated in FIG. 9.

Where the process comprises passing the deposit liquid through an aperture and simultaneously moving the substrate relative to the said aperture or apertures, these actions are usually performed simultaneously for at least 1 microsecond. For example, these actions may be performed simultaneously for at least a second, for example for at least ten seconds. It should be noted that in these embodiments, passing the deposit liquid through an aperture may comprise passing the deposit liquid through an aperture in a continuous or in a discontinuous fashion.

Where the process comprises passing the deposit liquid through an aperture and simultaneously moving the substrate relative to the said aperture, this will cause the deposit liquid to be distributed over more than one location on the substrate. Where the relative motion occurs in a single direction, the relative motion will cause the deposited volume of deposit liquid to be elongated in shape. Accordingly, in some embodiments of the invention the process comprises moving the said substrate relative to the said aperture or apertures to form the said volume of the deposit liquid and preferably the said volume of carrier liquid in an elongated shape.

The precise shape of this volume is not particularly limited and will be determined by the pattern of relative movement of the substrate and the aperture. The deposited volume of deposit liquid may be formed in any two dimensional shape. For example, the deposit may be caused to be in an L-shape, a quadrilateral such as a square, a spiral and so on. Generally, the volume of deposit liquid is formed in a line, such as a straight line.

Where the process comprises passing a continuous flow of the deposit liquid through an aperture and simultaneously moving the substrate relative to the said aperture, a single volume of deposit liquid will usually be formed on the substrate. Thus, a continuous two-dimensional shape may be printed on the substrate. However, where the process comprises passing a discontinuous flow of the deposit liquid through an aperture and simultaneously moving the substrate relative to the said aperture, the printed two-dimensional shape may consist of a plurality of volumes of deposit liquid (droplets) on the substrate.

Where the process comprises further comprises providing a carrier liquid through an aperture and simultaneously moving the substrate relative to the said aperture, the shape of the volume of carrier liquid on the substrate will also be determined by that motion. Where the deposit liquid and the carrier liquid are simultaneously passed through the same aperture onto the substrate, the volume of deposit liquid and the volume of carrier liquid will have similar shapes.

Accordingly, in one embodiment of the invention here the process comprises passing a deposit liquid through an aperture and simultaneously moving the substrate relative to the said aperture, a volume of deposit liquid and preferably a volume of carrier liquid are formed on the substrate in a line shape.

The means by which the relative motion of the substrate and aperture(s) are controlled are not particularly limited. For example, the substrate and/or the aperture(s) may be moved manually. Preferably, though, the relative motion is controlled by a computer. For example, the relative motion may be effected by a computer programmed to move the aperture(s) and/or the substrate.

In some embodiments, the substrate is mounted on a translational stage. Its motion in the X and/or Y directions may be controlled manually but are more typically controlled by a computer running a suitable computer programme.

In a particular embodiment of the process of the invention, the movement of the aperture relative to the substrate can be used to control the resolution of the printed features (that is, their size, for example the line width). As the skilled person will appreciate, by increasing the speed of movement of the aperture and substrate relative to one another, the amount of deposit liquid provided to the substrate in any unit of time will be spread over a larger area of the substrate.

In some embodiments, printing resolution may be improved by increasing the speed of motion of the aperture(s) relative to the substrate. For example, line width may be decreased by increasing the speed of motion of the aperture(s) relative to the substrate. This is particularly the case where the process is performed in continuous flow mode (such as in parallel flow mode).

Where a continuous flow of deposit liquid is provided to an aperture the process may be caused to produce a plurality of volumes of deposit liquid on the substrate by moving the substrate and aperture relative to one another at an elevated speed. This can cause the deposited volume of deposit liquid to become so narrow that it splits into droplets in order to reduce interfacial tension with its surroundings. Therefore altering the speed of the relative motion of the aperture and substrate can affect the shape of the volume(s) of deposit liquid formed on the substrate by the process.

Where a discontinuous flow of deposit liquid is provided to an aperture, the speed of the motion of the aperture in relation to the substrate will affect the shape of the printed feature as discussed above. That speed will also affect the separation of the printed features; the faster the relative motion, the greater the distance separating each volume of deposit liquid in a plurality of deposited volumes of deposit liquid. On the other hand, if the relative motion is slow the separate volumes of deposit liquid provided to the aperture may come into contact when deposited on the substrate and may therefore combine to form a single deposited volume of deposit liquid.

In some embodiments, the process of the invention involves controlling the speed at which the substrate and the aperture(s) are moved relative to one another in order to control the resolution of the printing process. In particular, the process of the invention may involve controlling the speed at which the substrate and the aperture(s) are moved relative to one another in order to control the size and/or the shape of the volume(s) of deposit liquid formed on the substrate. By aperture(s) in this paragraph is particularly meant the aperture to which deposit liquid is provided, and optionally also the aperture to which carrier liquid is provided.

Removal of the Carrier Liquid

In the printed article produced by the method of the invention, the carrier liquid is lost from around the deposit liquid or deposit material. In some embodiments, therefore, the process comprises removing the volume of the carrier liquid from around the volume of the deposit liquid. However, it is often unnecessary to take active steps to remove the carrier liquid. Accordingly, the process of removing the carrier liquid from around the deposit liquid may involve allowing the carrier liquid to be lost from around the deposit liquid.

In many embodiments, the carrier liquid may evaporate from around the deposit liquid. For example, where the carrier liquid is an organic liquid it may be a volatile organic liquid that can evaporate easily. Therefore, in some embodiments the step of removing the volume of the carrier liquid from around the volume of the deposit liquid comprises allowing the carrier liquid to evaporate. In other embodiments, the step of removing the volume of the carrier liquid from around the volume of the deposit liquid comprises heating and/or washing the substrate having one or more volumes of deposit liquid and one or more volumes of carrier liquid thereon.

Removing the volume of the carrier liquid from around the volume of the deposit liquid does not always require the deposit liquid to be removed from the substrate. For instance, the carrier liquid may soak into the substrate over time. Alternatively, the carrier liquid may disperse (for instance, may roll away) to another part of the substrate. In general, however, the process involves a step of removing the carrier liquid from the substrate entirely so that the printed article does not comprise the carrier liquid.

Usually, to produce the printed article, all of the carrier liquid may be lost from the substrate. Therefore, the process may comprise a step of allowing all of the carrier liquid deposited on the substrate to be lost from the substrate. If the carrier liquid is not automatically lost over time under the conditions of the process, the process may comprise a step of removing all of the carrier liquid deposited on the substrate to be lost from the substrate. By "all of the deposited carrier liquid" in this context is meant "substantially all of the deposited carrier liquid", for example at least 60%, 75% or 90% by weight of the deposited carrier liquid. In some embodiments, "all of the deposited carrier liquid" is at least 99% or at least 99.5% by weight of the deposited carrier liquid.

The step of removal of the carrier liquid may occur before or after the deposit liquid is converted into printed material as in the final printed article. That conversion will be discussed in more detail below. It should be noted that, where the step of removal of carrier liquid from around the deposit liquid is performed after conversion of the deposit liquid to printed material, the step in fact corresponds to removal of carrier liquid from around the printed material.

The Deposit Liquid

The deposit liquid and the carrier liquid are immiscible. Therefore, phase separation between the deposit liquid and the carrier liquid occurs where they meet. This is generally achieved by using two different, immiscible liquids as the basis for the deposit liquid and the carrier liquid. For instance, the deposit liquid and the carrier liquid may each comprise a solvent wherein the said solvents are immiscible.

By "solvent" is meant a liquid which forms a part of the deposit liquid or carrier liquid compositions. A solvent may or may not comprise a solute dissolved therein. A solvent may or may not contain particles of undissolved matter, for example suspended particles of solid or colloids. A solvent may or may not contain an emulsion of liquid droplets therein, but usually it does not contain such an emulsion.

Typically, the carrier liquid comprises a first solvent and the deposit liquid comprises a second solvent wherein the first and second solvents are immiscible. Typically, the carrier liquid consists essentially of a first solvent and the deposit liquid consists essentially of a second solvent wherein the first and second solvents are immiscible. For example, the deposit liquid may comprise at least 75% by weight of a first solvent and the carrier liquid may comprise at least 75% by weight of a second solvent wherein the first and second solvents are immiscible. In another example, the deposit liquid may comprise at least 90% by weight of a first solvent and the carrier liquid may comprise at least 90% by weight of a second solvent wherein the first and second solvents are immiscible.

The aforementioned solvents may each comprise a single chemical entity or a mixture of chemical entities. For example, where a solvent is used to refer to an organic solvent, the solvent may comprise a mixture of organic solvents (e.g. pentane and hexane, ethanol and methanol, and so on). Typically, one of the solvents is water and the other is not. For instance, one solvent may be water and the other may be an organic liquid. In another typical example, one solvent may be water and the other may be a mixture of organic liquids. Often, one solvent may be water and the other may be an organic liquid comprising one or more selected from the group consisting of pentane, hexane, and heptane.

The skilled person would easily understand how to determine whether two liquid are immiscible. Immiscible liquids do not mix. Thus, as a simple test, any two liquids may be shaken or stirred together and if separate regions of the two liquids are subsequently observed, it may be concluded that the two liquids do not mix. The skilled person will appreciate that a wide variety of other tests are available to determine whether two liquids are immiscible. Moreover, many combinations of immiscible liquids are well-known. For instance, water-based liquids are generally immiscible with hydrocarbon-based liquids such as oils.

The volumes of deposit liquid and carrier liquid formed on the surface of the substrate do not mix. A volume of deposit liquid in a volume of carrier liquid on a substrate therefore has at least two regions of differing composition: a region consisting of the deposit liquid and another region consisting of carrier liquid.

The deposit liquid is typically denser than the carrier liquid. For instance, the deposit liquid typically has a density of about 1 g/cm$^3$ or more while the carrier liquid typically has a density of less than 1 g/cm$^3$. In other embodiments, the density of the deposit liquid is typically at least 0.1 g/cm$^3$ greater than the density of the carrier liquid.

Typically, the deposit liquid comprises a deposit material and a solvent. By "deposit material" is meant a substance to be printed on the printed article. Typically, the process comprises losing all or part of the solvent from the deposit liquid to leave the deposit material on the substrate, as will be discussed in more detail below.

In some embodiments, the deposit liquid comprises more than one solvent. In some embodiments, the deposit liquid comprises more than one deposit material. Among these embodiments, it is usually the case that the deposit liquid comprises a single solvent. It is also usually the case that the deposit liquid comprises one deposit material.

The deposit liquid usually consists mostly of solvent by weight. That is, the deposit liquid usually comprises at least 50% by weight of solvent, for example at least 75% by weight of solvent, for example at least 90% by weight of solvent. The deposit liquid usually consists of less than 50% by weight of deposit material. For example, the deposit material may comprise 25% or less, or 10% or less, of the weight of the deposit liquid.

In some embodiments, the deposit material comprises a deposit material and a solvent wherein all or part of the deposit material is dissolved in the said solvent. In some embodiments, the deposit material comprises a deposit material and a solvent wherein all or part of the deposit material is in the form of undissolved particles. In some aspects of this embodiment, all or part of the deposit material may be suspended in the said solvent.

In some embodiments of the invention, the deposit liquid comprises an ink. An ink is a mixture of a pigment and a solvent. A pigment is a deposit material, which may be soluble or insoluble in the solvent. Typically, the pigment is insoluble in the solvent. A pigment is usually an inorganic compound which can adsorb and/or reflect light of a particular range of wavelengths. Typical pigments include metal compounds such as transition metal compounds. In some cases, the pigment may be a biological pigment.

The precise nature of the deposit material is not particularly limited. In some embodiments, the deposit material comprises particles which may be dispersed in a solvent. In some embodiments, the deposit material comprises a solute which may be dissolved in a liquid. Typically, the deposit material comprises solid particles.

Conveniently, the deposit material comprises particles which may adhere to the substrate. For instance, the deposit material may comprise particles which can adsorb (for example physisorb) to the substrate. By adsorption is meant that the particles will adhere to the substrate without the need for an adhesive or further bonding process. However, in other embodiments (for example where the process comprises a further bonding process), the particles of the deposit material need not be capable of adhering to the substrate.

In some embodiments, the deposit material comprises a pigment. In some embodiments of the invention, deposit material comprises a conductive material. Examples of suitable conducting materials include metal particles such as metal nanoparticles; conducting polymers; graphite particles; graphene particles; and particles of semiconducting materials.

In a preferred embodiment, the deposit liquid comprises a deposit material which is a conductive material, for example metal nanoparticles.

The deposit material may comprise one or more constituents. In some embodiments, the deposit material may comprise one constituent (for instance one type of pigment or one type of conductive material). In other embodiments, the deposit material may comprise a plurality of constituents (for instance two or more pigments, two or more kinds of metal nanoparticles, a metal nanoparticle and a polymer, and so on). This is particularly advantageous where the different constituents perform different functions. For instance, one constituent may be suitable for bonding the deposit material to the surface while the other may provide colour or conductive properties.

Where the deposit liquid comprises a solvent, the nature of the solvent is not particularly limited, provided of course that the deposit liquid is immiscible with the carrier liquid and preferably denser than the carrier liquid. Usually, the solvent is a flowable liquid. Conveniently, the solvent may be sufficiently volatile that any excess of solvent can evaporate from the substrate after printing. The said solvent (referred to as a deposit solvent herein) may be polar or non-polar. Suitable polar solvents include, for instance, water or ethanol. The deposit solvent may be an aqueous solvent or an organic solvent. Where the deposit solvent is an organic solvent it is typically selected from a hydrocarbon (for instance a $C_{5-16}$ alkane such as pentane, hexane or heptane or a $C_{5-16}$ alkene); a chlorinated hydrocarbon (for instance a chlorinated $C_{1-5}$ alkane such as chloroform or dichloromethane); an aromatic organic solvent (for instance a $C_{6-10}$ aromatic solvent such as benzene or toluene); an alcohol (such as a $C_{1-6}$ alcohol, for instance ROH wherein R is $C_{1-6}$ alkyl); an ester (such as a $C_{2-10}$ ester, or for instance an ester of formula RC(O)OR' wherein R and R' are the same or different and are $C_{1-6}$ alkyl); a ketone (for instance a ketone of formula RC(O)R' wherein R and R' are the same or different and are $C_{1-6}$ alkyl); or an ether (such as a $C_{2-6}$ ether, or for instance an ether of formula ROR' wherein R and R' are the same or different and are $C_{1-6}$ alkyl). A wide variety of organic solvents are suitable deposit solvents. However, in a preferred embodiment, the deposit liquid comprises a solvent which is a polar solvent. Particularly preferably the deposit solvent is water.

Where the deposit liquid comprises a deposit material, the deposit liquid may further comprise an additive to stabilise the deposit material. For example, the deposit liquid may comprise a salt.

In some embodiments, the deposit liquid may comprise an additive to modify its viscosity. There are various advantages to modifying the viscosity of the deposit liquid. In particular, increasing the viscosity of the deposit liquid may stabilise a parallel flow of deposit liquid and carrier liquid through a flow channel or aperture by reducing its tendency to separate into droplets. Similarly, increasing the viscosity of the deposit liquid reduces the tendency of a volume of deposit liquid on a substrate to split up into a plurality of volumes. Accordingly, in some embodiments of the invention the deposit liquid comprises a viscosifying agent. For instance, the deposit liquid may comprise 0.1 to 10% of a viscosifying agent.

Usually, the viscosity of the deposit liquid differs from the viscosity of the carrier liquid. It is preferable that viscosity of the deposit liquid should be higher than that of the carrier liquid. This helps to ensure that the deposit stream remains stable while passing through a flow channel or aperture and does not break up into droplets before or after deposition on the substrate. However, where it is preferred that the deposit liquid breaks up into droplets either before reaching the aperture (to form a discontinuous flow) or on the surface of the substrate, it may be preferred that the viscosity of the deposit liquid is lower than the viscosity of the carrier liquid.

Usually, the surface tension of the deposit liquid differs from the surface tension of the carrier liquid. In some embodiments, the viscosity of the deposit liquid differs from the viscosity of the carrier liquid and the surface tension of the deposit liquid differs from the surface tension of the carrier liquid.

In some embodiments of the invention, the deposit liquid may comprise an agent for modifying its surface tension. The agent may be a polyhydric (e.g. dihydric) alcohol or a monohydric alcohol, for instance ethylene glycol, methanol or ethanol. When modifying the surface tension or surface energy of the deposit liquid, there are various factors to consider.

A high surface energy of the deposit liquid can reduce the likelihood of splashing.

Usually, the surface energy of the deposit liquid that is most important is its surface energy at the interface with the carrier liquid, $\sigma_{dc}$. Where $\sigma_{dc}$ is high, there is a tendency to reduce the size of the interface between the deposit and carrier liquids and this favours the formation of a droplet flow regime through a flow channel or aperture. Accordingly, where a droplet flow formation is desired, the deposit liquid may comprise an agent suitable for increasing the surface tension with the carrier liquid. For instance, where the deposit liquid is polar and the carrier liquid is non-polar, the deposit liquid may comprise an ionic agent to discourage favourable interactions with the carrier liquid.

On the other hand, where $\sigma_{dc}$ is low, the inventors have observed that parallel flows are stabilised. Thus lowering $\sigma_{dc}$ can stabilise narrower streams of deposit liquid through an aperture or flow channel and allow the printing of lines with higher resolution. Accordingly, in some embodiments the deposit liquid may comprise an agent suitable for decreasing the surface tension at the interface with the carrier liquid. For instance, where the deposit liquid is polar and the carrier liquid is non-polar, the deposit liquid may comprise an agent soluble in the polar liquid which can also interact with the carrier liquid. By way of example, where the deposit liquid comprises water and the carrier liquid is a hydrocarbon, suitable additives for reducing $\sigma_{dc}$ include polyhydric (e.g. dihydric) alcohols and monohydric alcohols, for instance ethylene glycol, methanol and ethanol.

Thus, in some embodiments the deposit liquid comprises an agent for modifying its surface tension. This may for example be a polyhydric (e.g. dihydric) alcohol or a monohydric alcohol, such as ethylene glycol, ethanol or methanol, for instance ethylene glycol or methanol. For example, the deposit liquid may comprise 0 to 25% by weight of an agent for modifying its surface tension, e.g. 5 to 15% by weight or approximately 10% by weight of such an additive. In some embodiments (typically where a discontinuous flow of deposit liquid is desired) this may be an additive for increasing the surface tension at the interface with the carrier liquid. In other embodiments (typically where a continuous flow of deposit liquid is desired) this may be an additive for decreasing the surface tension at the interface with the carrier liquid.

In order to modify $\sigma_{ds}$, not only the deposit liquid but also the carrier liquid may comprise an additive for modifying the surface tension at the interface with the carrier liquid. Thus, in some embodiments, only the carrier liquid comprises an additive for modifying $\sigma_{ds}$. In other embodiments, only the deposit liquid comprises an additive for modifying $\sigma_{ds}$. In yet further embodiments, both the deposit liquid and the carrier liquid comprise an additive for modifying $\sigma_{ds}$.

Thus the invention provides a process wherein the deposit liquid and/or the carrier liquid comprise an agent for reducing the interfacial tension between the deposit liquid and the carrier liquid.

Where the carrier liquid comprises an additive or agent for modifying its interfacial tension at the boundary with the deposit liquid, suitable examples of such additives/agents include polyhydric (e.g. dihydric) alcohols and monohydric alcohols, such as, for example, ethylene glycol, ethanol and methanol, for instance ethylene glycol or methanol. Where the carrier liquid comprises such an additive, the carrier liquid may comprise 0 to 25% by weight of an agent for modifying its surface tension, e.g. 5 to 15% by weight or approximately 10% by weight of such an additive. In some embodiments (typically where a discontinuous flow of deposit liquid is desired) this may be an additive for increasing the surface tension at the interface with the deposit liquid. In other embodiments (typically where a continuous flow of deposit liquid is desired) this may be an additive for decreasing the surface tension at the interface with the deposit liquid.

As the skilled person will appreciate, wherever an additive capable of modifying the surface energy at an interface is added to the deposit liquid and/or the carrier liquid, the implications for all relevant surface energies must be borne in mind. As is clear from Equation 2 above, the contact angle of the deposit liquid with the substrate ($\theta^*$) is affected by $\sigma_{ds}$, $\sigma_{sc}$ and $\sigma_{sd}$. Decreasing $\sigma_{ds}$ can stabilise a parallel flow, improving the ability of the process to produce stable, narrow lines by a parallel flow of deposit liquid and carrier liquid. However, Equation 2 shows that decreasing $\sigma_{ds}$ can also increase $\theta^*$. As the skilled person will appreciate, in light of the present disclosure, any additive for modifying surface tension can readily be tested to check that it improves printing resolution.

Carrier Liquid

Typically, the carrier liquid comprises a solvent. The nature of the carrier liquid and any optional additives therein must be selected with reference to the deposit liquid, as discussed above. The carrier liquid is immiscible with the deposit liquid. Typically the carrier liquid is less dense than the deposit liquid.

The nature of the solvent is not particularly limited, provided of course that the carrier liquid is immiscible with the deposit liquid and preferably less dense than the deposit liquid. Usually, the solvent is a free-flowing liquid. Conveniently, the solvent may be sufficiently volatile that any excess of solvent can evaporate from the substrate after printing. The said solvent (also referred to as a carrier solvent herein) may be polar or non-polar. Suitable polar solvents include, for instance, water or ethanol. The carrier solvent may be an aqueous solvent or an organic solvent. Where the carrier solvent is an organic solvent it is typically selected from a hydrocarbon (for instance a $C_{5-16}$ alkane such as pentane, hexane or heptane or a $C_{5-16}$ alkene); a chlorinated hydrocarbon (for instance a chlorinated $C_{1-5}$ alkane such as chloroform or dichloromethane); an aromatic organic solvent (for instance a $C_{6-10}$ aromatic solvent such as benzene or toluene); an alcohol (such as a $C_{1-6}$ alcohol, for instance ROH wherein R is $C_{1-6}$ alkyl); an ester (such as a $C_{2-10}$ ester, or for instance an ester of formula RC(O)OR' wherein R and R' are the same or different and are $C_{1-6}$ alkyl); a ketone (for instance a ketone of formula RC(O)R' wherein R and R' are the same or different and are $C_{1-6}$ alkyl); or an ether (such as a $C_{2-6}$ ether, or for instance an ether of formula ROR' wherein R and R' are the same or different and are $C_{1-6}$ alkyl). A wide variety of organic solvents are suitable carrier solvents.

The carrier liquid may comprise more than one solvent. Where the carrier liquid comprises more than one solvent, the said more than one solvents are typically miscible with one another. More usually, the carrier liquid comprises a single solvent.

Usually, where one of the carrier liquid or the deposit liquid comprises a polar solvent, the other liquid comprises a non-polar solvent. For example, the carrier liquid may be a non-polar liquid and the deposit liquid may be a polar liquid; alternatively, the deposit liquid may be a non-polar liquid and the carrier liquid may be a polar liquid. In a preferred embodiment, the carrier liquid comprises a solvent which is a non-polar solvent. For instance, the carrier liquid may consist of a non-polar solvent. Particularly preferably the carrier solvent is hexane. It may alternatively for instance be ethyl acetate or diethyl ether.

In a particular embodiment of the invention, the deposit liquid comprises a polar solvent and the carrier liquid comprises a non-polar solvent. For example, the deposit liquid may comprise an hydrophilic solvent and the carrier liquid may comprise a hydrophobic solvent. Suitable polar solvents include, for instance, water or ethanol. In one embodiment the deposit liquid may comprise an aqueous solvent and the carrier liquid may comprise an organic solvent such as a hydrocarbyl solvent or a hydrocarbon solvent, provided of course that the deposit liquid is immiscible with, and preferably denser than, the carrier liquid. The organic solvent may for instance be a hydrocarbon (for instance a $C_{5-16}$ alkane such as pentane, hexane or heptane or a $C_{5-16}$ alkene); a chlorinated hydrocarbon (for instance a chlorinated $C_{1-5}$ alkane such as chloroform or dichloromethane); an aromatic organic solvent (for instance a $C_{6-10}$ aromatic solvent such as benzene or toluene); an alcohol (such as a $C_{1-6}$ alcohol, for instance ROH wherein R is $C_{1-6}$ alkyl); an ester (such as a $C_{2-10}$ ester, or for instance an ester of formula RC(O)OR' wherein R and R' are the same or different and are $C_{1-6}$ alkyl); a ketone (for instance a ketone of formula RC(O)R' wherein R and R' are the same or different and are $C_{1-6}$ alkyl); or an ether (such as a $C_{2-6}$ ether, or for instance an ether of formula ROR' wherein R and R' are the same or different and are $C_{1-6}$ alkyl), provided of course that the deposit liquid is immiscible with, and preferably denser than, the carrier liquid.

As discussed in relation to deposit liquids, in some embodiments the carrier liquid comprises an agent for modifying its surface tension.

Where the carrier liquid comprises an additive, that additive is typically soluble in the carrier liquid. The carrier liquid is therefore usually substantially free of solid particles. For instance, the carrier liquid may be free from solid particles. Typically, the carrier liquid does not comprise a pigment. Typically, the carrier liquid does not comprise any conductive particles such as metal nanoparticles or particles of other conductive materials.

Substrate

The nature of the substrate is not particularly limited. The substrate is a solid material. Thus the substrate may comprise one or more of metal, plastic, glass or natural fibres (typically paper). Preferably, the substrate comprises one or more plastics. The substrate may consist of any one of metal, plastic, glass or natural fibres (typically paper). In some embodiments, the substrate consists of one or more plastics.

The substrate may be coated with a coating. For example, the substrate may be coated with a coating to affect its surface energy at the boundary with the medium in which the process is performed (usually air) or with the deposit liquid or carrier liquid.

In the process of the invention, generally the substrate is a solid material, e.g. plastic. For instance, the substrate may comprise or consist of polyethylene naphthalate.

The substrate may be capable of absorbing the deposit liquid and/or the carrier liquid. For example, the substrate may be capable of absorbing a deposit solvent and/or a carrier solvent. More typically, though, the substrate is not an absorbent material. For example, the substrate may not readily absorb liquids. In some embodiments, the substrate may not be absorbent to the deposit liquid. In some embodiments, the substrate may not be absorbent to the carrier liquid. Often, the substrate is not absorbent to either the deposit liquid or the carrier liquid.

The form of the substrate is not particularly limited. In general, the substrate comprises a deposition surface, and the volume or volumes of the deposit liquid and the volume or volumes of the carrier liquid are deposited on said deposition surface. Typically, the deposition surface is substantially flat. In the process of the invention, the deposit liquid and the carrier liquid are usually passed through an aperture vertically above the deposition surface.

The advantage of a flat surface is that it may be positioned horizontally. This minimises the tendency for any volumes of deposit liquid and/or carrier liquid on the surface to move (under the influence of gravity) away from the position at which they are printed by the process of the invention.

The material from which the substrate is made may influence its surface energy at the boundary with the medium in which the process is performed (usually air) or with the deposit liquid or carrier liquid. Where the surface energy at the boundary with the said medium in which the process is performed (usually air), the substrate tends to reduce the size of its interface with that medium. Thus, a high surface energy with that medium favours wetting by any liquid thereon. This can favour spreading of the deposit liquid and decrease printing resolution. It may therefore be preferred to select a substrate which has a low surface energy at the boundary with the medium in which the process is performed.

Where the substrate has a high surface energy of interaction with the deposit liquid, this encourages volumes of deposit liquid thereon to split into separate smaller volumes to reduce the area of interaction. Thus, where it is desired that the deposit liquid on the substrate takes the form of droplets, a high surface energy of interaction between the deposit liquid and the substrate may be favoured. On the other hand, if it is desired to form a single unbroken volume of deposit liquid on the substrate, a low energy of interaction between substrate and deposit liquid may be preferred.

As the skilled person will appreciate, the surface energy at the boundaries between the deposit liquid and the substrate and the carrier liquid and the substrate will affect $\theta^*$ as in Equation 2.

It may therefore be desirable to modify the substrate to alter its surface energy with one or more of air, the deposit liquid and the carrier liquid.

In some embodiments of the invention, the substrate is treated to increase its surface energy. In other embodiments of the invention, the substrate is treated to decrease its surface energy.

In some embodiments of the invention, the substrate is treated to decrease its contact angle with the deposit liquid.

In some embodiments of the invention the substrate is treated to increase its wettability. In other embodiments of the invention, the substrate is treated to decrease is wettability.

A possible method of treating the surface to modify its surface energy with air (for instance to increase its hydrophilicity or wettability) is to expose the surface to ozone plasma. Thus, in some embodiments of the invention, the surface of the substrate is exposed to ozone plasma. Typically, the substrate may be exposed to ozone plasma for at least ten seconds. For instance, the substrate may be exposed to ozone plasma for 1 to 10 minutes, preferably from 2 to 5 minutes. Ozone treatment is particularly suited to plastic surfaces such as polyethylene napthalate.

Another possible method of treating the surface to modify its surface energy is to modify the surface structurally, for example by etching. A further possible method of treating the surface to modify its energy is to coat the surface of the substrate.

In some embodiments, the process of the invention comprises a step of treating the substrate as defined therein.

In some embodiments, the process of the invention comprises treating the substrate to increase its contact angle with the deposit liquid.

In some embodiments, the process of the invention comprises treating the substrate to increase its surface energy. In other embodiments, the process of the invention comprises treating the substrate to decrease its surface energy.

In some embodiments, the process of the invention comprises treating the substrate to increase its surface energy. In other embodiments, the process of the invention comprises treating the substrate to decrease its surface energy.

In some embodiments, the process of the invention comprises exposing the substrate to ozone plasma. Typically, the substrate is exposed to ozone plasma for at least ten seconds, for example from 1 minute to 10 minutes or 2 minutes to 5 minutes.

In some embodiments, the process comprises etching the substrate to modify its surface energy. In other embodiments, the process comprises coating the substrate to modify its surface energy.

Conversion of Deposit Liquid

Commonly, the deposit liquid requires some processing after it is deposited in order to produce the final printed article. Usually, this process involves conversion of a volume of deposit liquid on the substrate to a solid. Accordingly, in some embodiments the process of the invention comprises a step of converting a volume of the deposit liquid to a solid.

The conversion of the volume of deposit liquid to a solid may not require a process step to be actively taken. For example, the conversion of the volume of deposit liquid to a solid may involve a drying step. Where the deposit liquid comprises a deposit solvent, the process may involve allowing the deposit solvent to be lost from the deposit liquid, leaving a solid material. Where the deposit liquid comprises a deposit solvent and a deposit material, the process may involve a step of allowing the deposit solvent to be lost from the deposit liquid, leaving a solid comprising the deposit material.

The loss of the deposit solvent may be achieved by allowing the deposit solvent to evaporate. Accordingly, in some embodiments of the process of the invention wherein the deposit liquid comprises a solvent, the step of converting the said volume of deposit liquid to a solid comprises evaporating said solvent. For example, the process may comprise drying a volume of deposit liquid.

The deposit solvent may be left to evaporate over time. However, the process may be accelerated by heating the substrate with a volume of deposit liquid thereon. Thus, in some embodiments the process comprises heating the substrate having a volume of deposit liquid thereon. The process may also be accelerated by, for example, providing an air current to the substrate with a volume of deposit liquid thereon.

Where the conversion of the deposit liquid to a solid comprises allowing the deposit solvent to evaporate, this typically occurs after the carrier liquid is removed from around the deposit liquid. However, the deposit solvent and the carrier liquid may be lost concurrently, for example by evaporation.

Another way in which the deposit liquid may be lost is by absorption into the substrate. Where the conversion of the deposit liquid to a solid occurs by absorption of a deposit solvent, this typically occurs before the carrier liquid is lost or removed.

Other means of converting the deposit liquid to a solid may be used in the process of the invention. In addition to or instead of the loss of a deposit solvent, the deposit liquid may be solidified by a chemical reaction such as a polymerisation reaction. In other embodiments the conversion of the deposit liquid to a solid may be achieved by photoinduced cross-linking (e.g. photoinduced polymerisation), by thermally-induced cross-linking (e.g. thermally-induced polymerisation), cooling (e.g. freezing) and so on. Thus, in some embodiments the process comprises irradiating the deposit liquid. In some embodiments, the process comprises inducing a polymerisation reaction in the deposit liquid. In yet further embodiments, the process may comprise cooling the deposit liquid to a temperature at which it solidifies.

In particular, where the process of the invention comprises a step of converting a volume of deposit liquid to a solid, the process may comprise irradiating the deposit liquid. Usually, the irradiation may comprise irradiating the deposit liquid with thermal radiation, light radiation or ultraviolet radiation.

In general, where the process of the invention comprises a step of converting a volume of deposit liquid to a solid, the process may comprise one or more of:

inducing a cross-linking process in the deposit liquid; or cooling the deposit liquid to a temperature at which it solidifies;

which steps may be performed before or after the carrier liquid is lost or removed from the deposit liquid. The process may additionally or alternatively comprise a step of removing a deposit solvent, which typically occurs after the carrier liquid is lost or removed.

In some embodiments, the process may comprise a step of further processing the printed article. For example, the process may comprise a step of machining the substrate (e.g. cutting, splitting or shaping the substrate). In other examples, the process may comprise a step of further processing the printing article by baking or coating it. In yet further examples, the process may comprise subjecting a printed article obtained by the process of the invention to a further printing process according to the invention.

Printed Article

The invention provides a printed article obtainable by a process as defined herein. In preferred embodiments, the printed article of the invention is obtained or produced by a process as defined herein.

The printed article comprises a substrate and a deposit material thereon.

In the printed article of the invention, the substrate is as defined herein. The substrate is a solid material. Thus the substrate may comprise one or more of metal, plastic, glass or natural fibres (typically paper). Preferably, the substrate comprises one or more plastics. The substrate may consist of any one of metal, plastic, glass or natural fibres (typically paper). In some embodiments, the substrate consists of one or more plastics. For instance, the substrate may comprise or consist of polyethylene naphthalate. Typically, the substrate is not an absorbent material.

The substrate may be coated with a coating. For example, the substrate may be coated with a coating to affect its surface energy at the boundary with the medium in which the process is performed (usually air) or with the deposit liquid or carrier liquid.

The substrate typically has a deposition surface, wherein the deposition surface is substantially flat. Usually, printed material is present on the deposition surface.

The deposit material is the material printed on the substrate. The deposit material is usually solid. The deposit material is as defined above in relation to the deposit material carried by the deposit liquid. Thus, in some embodiments, the deposit material comprises solid particles. Often, these solid particles may adhere to the substrate. For instance, the deposit material may comprise particles which can adsorb (for example physisorb) to the substrate. However, in other embodiments, the deposit material may comprise an adherent such as a glue. The adherent performs the function of attaching other particles of the deposit material to the substrate.

In some embodiments, the deposit material comprises a pigment. In some embodiments of the invention, deposit material comprises a conductive material. Examples of suitable conducting materials include metal particles such as metal nanoparticles; conducting polymers; graphite particles; graphene particles; and particles of semiconducting materials.

In a preferred embodiment, the deposit material is a conductive material, for example metal nanoparticles.

The deposit material may comprise one or more constituent. In some embodiments, the deposit material may comprise one constituent (for instance one type of pigment or one type of conductive material). In other embodiments, the deposit material may comprise a plurality of constituents (for instance two or more pigments, two or more kinds of metal nanoparticles, a metal nanoparticle and a polymer, and so on). This is particularly advantageous where the different constituents perform different functions. For instance, one constituent may be suitable for bonding the deposit material to the surface while the other may provide colour or conductive properties.

The deposit material upon the substrate of the printed article may or may not differ from that present in the deposit liquid in the process of the invention. Where the deposit material in the printed article of the invention is obtainable simply by, for instance, evaporation of a deposit solvent, that is unlikely to cause any change to the deposit material. Accordingly, the deposit material in a printed article obtainable thereby will be the same as that in the original deposit liquid. However, where the deposit liquid is subjected to a reaction, the form of the deposit material may change its form. One example is where the deposit material in a printed article is a polymer obtainable by cross-linking.

The form of the deposit material is not particularly limited. As explained above, the process of the invention is capable of printing virtually any shape. For example, the deposit may be caused to be in an L-shape, a quadrilateral such as a square, a spiral and so on. Generally, the deposit material is elongated in shape. For instance, it may be in the form of one or more lines.

The deposit material may be in the form of a one or more separate dashes. The said one or more dashes are not particularly limited in shape. The length of a dash (i.e. its largest dimension) is typically not more than 100 times larger than its width (i.e. its smallest dimension). For example, the length of a dash may be not more than 50 or not more than 10 times larger than its width. In some embodiments, the one or more dashes may be approximately spherical in shape. For example, the length and width of the said dash or dashes may be approximately equal, e.g. the length of the dash may not be more than twice its width.

The printed features (i.e. the shapes made by the deposit material) in the printed article usually have dimensions in the nanometre or micrometre range. The width (that is, the smallest dimension) is typically from 1 nm to 100 µm. Usually, the width of the printed features is in the range from 50 nm to 50 µm. Preferably, the width of the printed features is in the range of from 100 nm to 20 µm, for example from 500 nm to 10 µm. In some embodiments, the width of the printed features is 20 µm or less, such as 15 µm or less or 10 µm or less. The length (that is, the longest dimension) is not particularly limited. Typically, the length is from 1 nm to 10 cm. Usually, the length of the printed features is in the range from 50 nm to 5 cm. Preferably, the length of the printed features is in the range from 100 nm to 1 cm, for example from 500 nm to 500 µm. In some embodiments, the length of the printed features is up to 1000 µm, for example up to 100 µm.

In a preferred embodiment, the printed article of the invention is a printed electronic article. By printed electronic article is meant an article which is capable of carrying an electric current. Typically the deposit material of the printed article is capable of carrying an electric current. Examples of a printed electronic article according to the invention are sensors, solar cells, touch screens and displays, antennae, RFID tags, electrodes, printed thin film devices, microelectronic integrated circuits, microelectromechanical systems, optoelectronic devices and DNA microassays.

Apparatus

An apparatus suitable for performing the process of the invention will now be described. In some embodiments of the invention, the process of the invention is performed using an apparatus as described herein.

The apparatus of the invention is an apparatus for producing a printed article by a process as defined herein, wherein the apparatus comprises:

a first device configured to provide a flow of a deposit liquid through the apparatus;
a second device configured to provide flow of a carrier liquid through the apparatus;
a first flow channel for carrying a deposit liquid;
a second flow channel for carrying a carrier liquid; and
an aperture for providing liquid to a substrate.

In some embodiments, the apparatus of the invention is configured to provide a deposit liquid and a carrier liquid through different apertures. In that case, the apparatus comprises a first aperture fed by the first flow channel for providing a deposit liquid to the substrate and a second aperture fed by the second flow channel for providing a carrier liquid to the substrate. In this embodiment, the first aperture and the second aperture are close together, for instance they may be adjacent to one another.

Where an aperture is said to be "fed by" a flow channel, it is meant that liquid passing through that flow channel is provided to that aperture. Therefore the flow channel is directly or indirectly linked to the aperture. In some embodiments, where an aperture is said to be "fed by" a flow channel, the aperture is attached to the flow channel. For example, the aperture may be attached to the end of the flow channel. In other embodiments, the flow channel may be indirectly linked to the aperture, for example by one or more further flow channels or tubes. Preferably, the aperture is attached to the flow channel.

In a preferred embodiment, the apparatus is configured to provide a deposit liquid and a carrier liquid to a substrate via the same aperture. In a preferred embodiment, the apparatus comprises an aperture for providing the deposit liquid and the carrier liquid to a substrate. Particularly, the apparatus may comprise an aperture for providing the deposit liquid and the carrier liquid together to a substrate. This could for example be achieved in a configuration where the first and second flow channels are directed to that aperture. In an example of such a configuration, the first and second flow channels are directed to a junction, and the junction is directed to (for instance attached to) the aperture. The apparatus may comprise a junction/channel which combines the flow of both the carrier liquid and deposit liquid.

This configuration of the apparatus is advantageously simple. In this case, the first aperture may be configured to provide both a deposit liquid and a carrier liquid to the substrate. In this embodiment, the apparatus of the invention comprises an aperture fed by the first flow channel and the second flow channel, for providing the deposit liquid and the carrier liquid to the substrate.

Where a single aperture is fed by the first and second flow channels, in some embodiments the first and second flow channels feed the aperture separately. That is, the first and second flow channels may each be attached to the aperture such that, when the apparatus is in use, the deposit liquid and carrier liquid meet at the aperture. More usually, however, the apparatus is configured such that, when the apparatus is in use, the deposit liquid and the carrier liquid are provided to the apparatus in a single flow channel. This may be achieved by providing the apparatus with means to combine a flow of deposit liquid with a flow of carrier liquid.

In some embodiments, the apparatus comprises a junction connecting the first flow channel and the second flow channel. The nature of the junction is not particularly limited. A junction is a connection between two or more flow channels. Typically, a junction is a connection between three flow channels. Usually, a junction is a connection between a first flow channel for carrying a deposit liquid, a second flow channel for carrying a carrier liquid, and a third flow channel for carrying a deposit liquid and a carrier liquid. The skilled person would understand that a wide range of laboratory fittings, such as tubing and tubing connectors, may be used to make such a junction.

A junction may be a Y-junction, which is a junction between three flow channels that are arranged in a Y-shape. A junction may alternatively be a T-junction, which is a junction between three flow channels that are arranged in a T shape. Other suitable examples of junctions are single and multi-component flow focussing junctions.

In many embodiments, the apparatus comprises a third flow channel for carrying the deposit liquid and the carrier liquid. Typically, the third flow channel is disposed between a junction and an aperture for providing a deposit liquid and carrier liquid to a substrate. Thus, in one embodiment the apparatus comprises an aperture for providing the deposit liquid and the carrier liquid to the substrate, wherein the aperture is fed by the said third flow channel.

In a particularly preferred embodiment, the apparatus of the invention comprises:
  a first device configured to provide a flow of a deposit liquid through the apparatus;
  a second device configured to provide flow of a carrier liquid through the apparatus;
  a first flow channel for carrying a deposit liquid, wherein the first flow channel is fed by the first device;
  a second flow channel for carrying a carrier liquid, wherein the second flow channel is fed by the second device;
  a third flow channel for carrying a deposit liquid and a carrier liquid;
  a junction connecting the first, second and third flow channels; and
  an aperture for providing liquid to a substrate connected fed by the third flow channel.

The first flow channel is usually disposed between the first device and a junction. The second flow channel is usually disposed between the second device and the junction. The third flow device is usually disposed between the junction and an aperture. By "disposed between" is meant that the flow channel is functionally connected to the named pieces of the apparatus, such that a flow of liquid may be carried therebetween by the flow channel.

In order to provide a flow of deposit liquid and a flow of carrier liquid through the apparatus, the apparatus comprises a first device configured to provide a flow of a deposit liquid through the apparatus and a second device configured to provide flow of a carrier liquid through the apparatus. The nature of the first device and second device are not particularly limited. They are devices capable of imparting energy to the deposit liquid and the carrier liquid respectively. The first and second devices may therefore be described as flow generators.

The first and/or second device may, for example, be devices capable of pressurising liquid, such that the liquid is caused to flow through the apparatus. In another example, the first and/or second device may be devices capable of agitating liquid (that is, imparting motion to liquid) such that the liquid is caused to flow through the apparatus. Less usually, the first and/or second device may be device which allows liquid to flow through the apparatus due to gravitational forces.

Typically, the first device is a pump, and/or the second device is a pump. Usually, both the first and second devices are pumps. As the skilled person will appreciate, various kinds of pumps are available which are suitable for incorporation into the apparatus. Particularly suitable pumps are peristaltic pumps and syringe pumps. Accordingly, in one embodiment, the first and preferably also the second device are pumps. In one aspect of this embodiment, the first device is a syringe pump, and/or said second device is a syringe pump. For instance, both the first device and the second device may be syringe pumps. In another aspect of this embodiment, the first device is a peristaltic pump, and/or the second device is a peristaltic pump. For instance, both the first device and the second device may be peristaltic pumps.

The devices may be configured to provide a deposit liquid and a carrier liquid at feed rates $q_d$ and $q_c$ respectively, wherein $q_c$ and $q_d$ are as defined above. The devices may be configured to provide liquid at a steady rate or at a rate that is not steady, wherein "steady" and "not steady" are as defined above.

In some embodiments, the first and/or second devices may be pressure controlled. For instance, the first and/or second devices may be configured to apply a particular pressure to a liquid therein. The first and/or second devices may be configured to maintain a particular pressure in a source of liquid (e.g. a reservoir feeding a flow channel). The said particular pressure may be fixed or may vary, so that a steady or not steady rate feed rate may be achieved.

In other embodiments, the first and/or second devices may be flow rate controlled. For instance, the first and/or second devices may be configure to supply a carrier liquid or deposit liquid at a particular flow rate. The said particular flow rate may be equal to feed rates $q_d$ and $q_c$ respectively, wherein $q_c$ and $q_d$ are as defined above.

In order to ensure that the first and second device produce the desired flow of carrier liquid and deposit liquid through the apparatus, the apparatus may comprise one or more flow controllers. Thus, in some embodiments the apparatus comprises one or more flow controllers for controlling the rate at which deposit liquid and/or carrier liquid is provided.

A flow controller is capable of ensuring that a device configured to provide a flow of liquid delivers the flow of liquid at a predetermined rate. Thus, in some embodiments, the apparatus comprises a flow controller configured to control the first and or the second device configured to provide a flow of liquid. In some embodiments, the apparatus comprises a first flow controller configured to control the first device and a second flow controller configured to control the second device. In other embodiments, the apparatus does not comprise a flow controller.

In some embodiments, a flow controller is a computer running a programme, which ensures that the first device and/or the second device deliver a flow of liquid through the apparatus at a predetermined rate. In some embodiments, the flow controller may further comprise a sensor for detecting a flow rate. The flow controller may be programmed to adjust the activity of the first and/or second device to ensure that the predetermined flow rates are achieved.

The apparatus of the invention comprises a first, second and optionally a third flow channel. The apparatus may optionally comprise additional flow channels. A flow channel is a channel along which liquid can flow. Usually, the flow channel is enclosed on all sides.

The flow channels in the apparatus may comprise any suitable tubing or channel. For example, the flow channels may be channels within or on the surface of a solid block. For instance, the flow channels may be channels in a metal, plastic or glass block. In one embodiment, one or more of the flow channels is a microchannel in a chip, such as a microfluidic chip. In other embodiments the flow channels may comprise a tubing such as PTFE tubing or capillary tubing. In a preferred embodiment, the first, second and third flow channels are channels in a microfluidic chip. Microfluidic chips are typically glass or plastic chips with fine channels etched into them and are used to manipulate the flow and interaction of small amounts of fluids.

The length of a flow channel in the apparatus of the invention is not particularly limited. For example, a flow channel may be up to two metres long, for example from 10 µm to 2 m in length. Preferably, a flow channel may be from 100 µm to 1 m in length.

Typically, said first flow channel, and/or said second channel, and/or said third channel are microchannels. By "microchannel" is meant a channel having a diameter on the order of micrometres. The diameter of a flow channel is typically at least as large as the aperture at which it ends, if it ends in an aperture. For example, the first, second and third flow channels in the apparatus of the invention may each have a diameter of from 1 to 500 µm, preferably 10 to 300 µm, more preferably 50 to 200 µm.

The apparatus of the invention comprises one or more apertures for providing deposit liquid and carrier liquid to a substrate. As explained above, an aperture is an opening through which liquid can pass. The aperture typically has a diameter of from 1 to 500 µm, preferably 10 to 300 µm, more preferably 50 to 200 µm.

In some embodiments of the apparatus of the invention, the aperture or apertures comprise an opening at the end of a flow channel. This may be, for instance, an outlet from a channel of a tube or a microfluidic chip.

In other embodiments, the aperture or apertures may comprise a nozzle. By nozzle is meant a piece attached to the end of a flow channel having a hole through which deposit liquid and/or carrier liquid can pass to reach the substrate. The hole is typically the same size or smaller than the diameter of the flow channel. The hole typically has a diameter of up to 500 µm, preferably up to 300 µm, more preferably up to 200 µm.

Often, a nozzle may have a cone shape. This can help to focus a flow of liquid emerging from a flow tube.

In some embodiments of the apparatus of the invention, the nozzle is a needle, for example a hypodermic needle.

In some embodiments, the apparatus comprises means for moving a substrate relative to an aperture or apertures. For example, the apparatus may comprise means for moving the aperture or apertures. Alternatively or additionally, the apparatus may comprise means for moving the substrate. Usually, said means comprise a mechanism for holding the aperture(s) and/or a substrate and for adjusting their relative positions. In some embodiments, the said means comprise a motor. Typically, said means also comprise a computer running a programme to control the mechanism and to move the aperture(s) and substrate relative to one another.

In some embodiments, the means for moving a substrate relative to an aperture or apertures is a translational stage. A translational stage is a moveable platform which can support or hold an object, for example a substrate. In some embodiments, the translational stage may be attached to one or more apertures and thus can move the one or more apertures. More typically, the translational stage can comprise a substrate. For example, the substrate may be placed on or affixed to the translational stage. Accordingly, in one embodiment the apparatus comprises a translational stage for moving the substrate relative to the aperture or apertures.

In one aspect of this embodiment, the apparatus comprises an X-Y translational stage. By X-Y translational stage is meant a stage which can move in the X and Y direction on the XY plane. The XY plane is a plane coincident with or parallel to the plane of the substrate that is printed by the operation of the apparatus of the invention.

Typically, the said one or more apertures are located vertically above the surface of the substrate when the apparatus is performing a printing process according to the invention. That is, the one or more apertures may be located above the XY plane. Typically, the aperture(s) are positioned close to the substrate surface when the apparatus is in use. For example, the said one or more apertures may be located within 1 mm of the substrate surface, or within 0.5 mm of the substrate surface.

In some embodiments, the apparatus comprises a heater element. This may assist in evaporating carrier liquid and/or deposit liquid from the substrate. It may also assist in solidifying the deposit liquid to form a solid.

Apparatus in Use

The apparatus of the invention may be used to perform the process of the invention. Accordingly, the invention provides the use of the apparatus of the invention to perform the process of the invention. The invention also provides the apparatus of the invention when used to perform the process of the invention.

Whilst it is used to perform the process of the invention, the apparatus comprises a deposit liquid, a carrier liquid and a substrate.

Therefore, in some embodiments of the apparatus of the invention, the first flow channel contains a deposit liquid.

In some embodiments of the apparatus of the invention the second flow channel contains a carrier liquid.

In some embodiments of the apparatus of the invention the third flow channel contains a deposit liquid and a carrier liquid.

In some embodiments of the apparatus of the invention, the apparatus comprises a substrate. In one aspect of this embodiment, the substrate is fixed to the translational stage. For example, the substrate may be clamped or otherwise held on the translational stage; alternatively the substrate may be adhered to the translational stage with an adhesive. In another aspect of this embodiment, the substrate may be placed on the translational stage.

In a preferred embodiment of the apparatus, the apparatus comprises:
- a first device configured to provide a flow of a deposit liquid through the apparatus;
- a second device configured to provide flow of a carrier liquid through the apparatus;
- a first flow channel containing a deposit liquid, wherein the first flow channel is fed by the first device;
- a second flow channel containing a carrier liquid, wherein the second flow channel is fed by the second device;
- a third flow channel containing a deposit liquid and a carrier liquid;
- a junction connecting the first, second and third flow channels; and
- an aperture for providing liquid to a substrate connected fed by the third flow channel.

In a particularly preferred aspect of this embodiment, the apparatus further comprises a translational stage comprising a substrate.

In the apparatus of the invention which is used to perform the process of the invention:
- the deposit liquid may be as defined herein;
- the carrier liquid may be as defined herein;
- the substrate may be as defined herein; and/or
- the deposit liquid and the carrier liquid together are as defined herein.

That is, the deposit liquid may have a cross-sectional area A' as it passes through the aperture, where A' is as defined herein. The deposit liquid may comprise a deposit material and a solvent, wherein the deposit material and solvent (also referred to as a deposit solvent) are as defined herein. For example, the deposit material may comprise metal nanoparticles. Furthermore, the deposit liquid may be converted to a solid as defined herein.

The carrier liquid may comprise a solvent (also referred to as a carrier solvent) wherein the carrier solvent is as defined herein.

The carrier liquid and/or the deposit liquid may comprise additives as defined herein.

The substrate is a solid material as defined herein. As explained above, the substrate is preferably plastic. The substrate may have a treated surface as defined herein; for example, the substrate may have a surface that is treated with ozone plasma.

The flow of the deposit liquid and the carrier liquid through the apparatus are as defined herein. Thus, the deposit liquid is provided by the first device at a flow rate $q_d$ and the carrier liquid is provided by the second device at a flow rate $q_c$, where $q_d$ and $q_c$ are as defined herein. The flow rates of the carrier liquid and deposit liquid through the aperture or apertures ($f_c$ and $f_d$) are as defined herein.

Typically, a laminar flow of deposit liquid and carrier liquid is established in the third flow channel. In some embodiments, the flow of deposit liquid is continuous and in others it is discontinuous, as discussed above. Thus, in some embodiments a parallel flow of deposit liquid and carrier liquid is established in the third flow channel. In other embodiments a discontinuous flow of deposit liquid is established in the third flow channel.

The process and apparatus of the invention will now be illustrated with reference to various Examples.

EXAMPLES

The experimental conditions used in the following Examples are as follows.

1. Formulation of Silver Nanoparticle Ink

Silver nanoparticles used as the deposit material were synthesized via the polyol process. Silver nitrate, ethylene glycol, sodium chloride and polyvinylpyrrolidone (PVP) with average molecular weight of 55000 were purchased from Sigma Aldrich. In a typical synthesis, 0.0955 g of silver nitrate is dissolved in 0.75 ml of ethylene glycol. In a separate glass vial, dissolve 1.0 g of PVP in 10 ml of ethylene glycol and heat the solution to 135° C. with magnetic stirring. 20 μL of a 0.15M aqueous sodium chloride solution is then added to the PVP solution. Once the solution is mixed homogenously, add in the silver nitrate solution and allow the reaction to occur for 1 hour. The synthesized silver nanoparticles are monodispersed with a diameter of approximately 40 nm. After the reaction, the nanoparticles are washed with methanol and centrifuged at 6000 rpm. This is repeated 3 times before finally redispersing the nanoparticles into water to form an aqueous deposit liquid or ink.

2. Solvo-Dynamic Printer Set-Up

Two syringe pumps (Harvard Apparatus Model '11' Plus 70-2208) are used to inject the silver nanoparticle ink and carrier solvent into a microfluidic Y-junction chip (Cellix Ltd) which has a channel width of 200 μm and channel depth of 50 μm. The fluids exit the chip through a 300 μm inner diameter outlet pin which also acts as a nozzle. The pin is positioned 100 μm above a polyethylene naphthalate (PEN) substrate which is placed on a computer-controlled translational stage (Thorlabs DDSM50). The substrates are treated with ozone-plasma prior to the printing using UV-Ozone cleaner (Ossila). The printed silver nanoparticle lines are dried on a hotplate at 110° C. for 10 mins. The dimensions of the printed features are characterized by a digital microscope (DinoLite).

Figure 10:
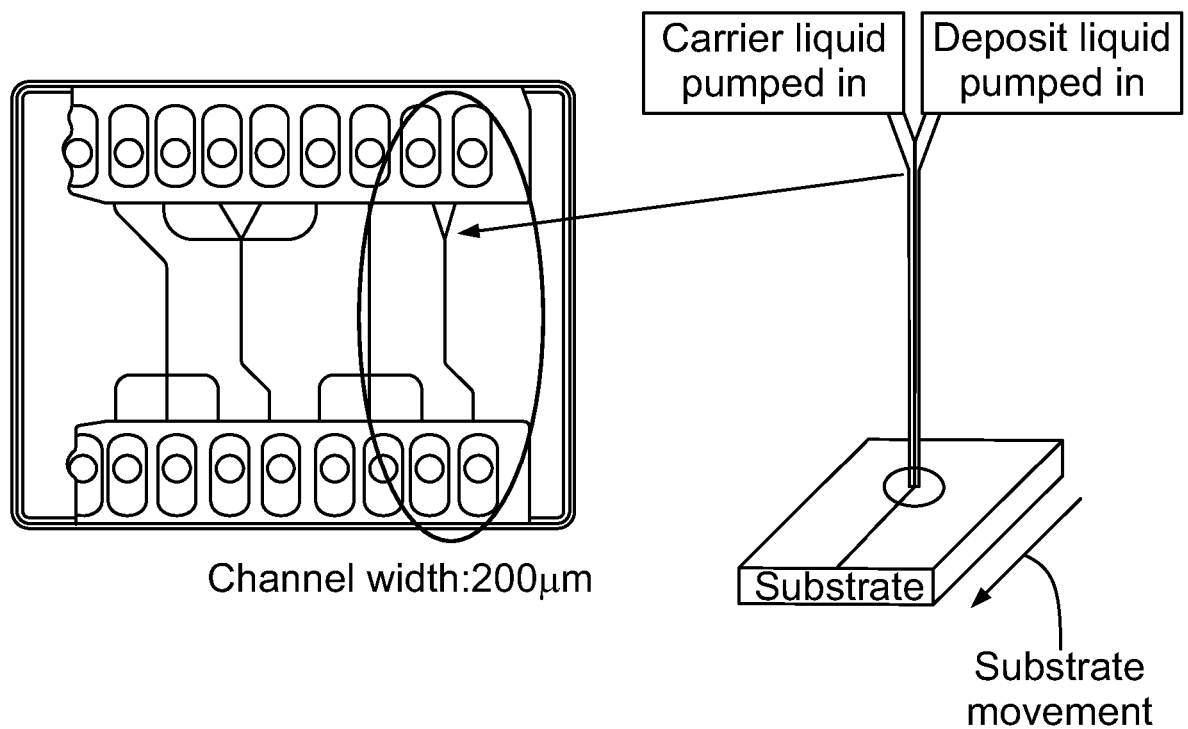
FIG. 10 shows a microfluidic chip comprising a Y-junction carrying deposit liquid and carrier liquid.
Figure 11:
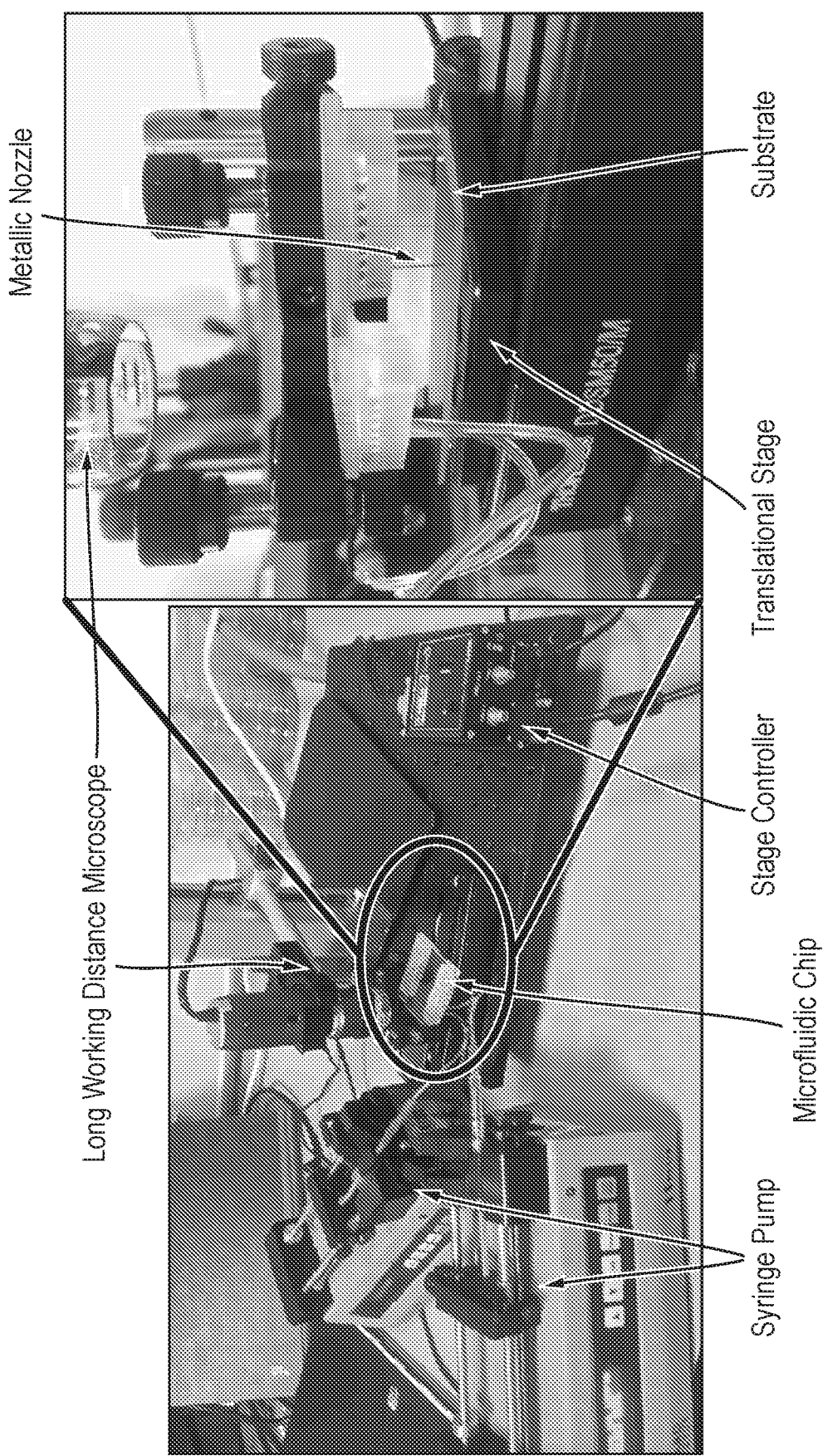
FIG. 11 shows the experimental setup used in the Examples.
Figure 14A:
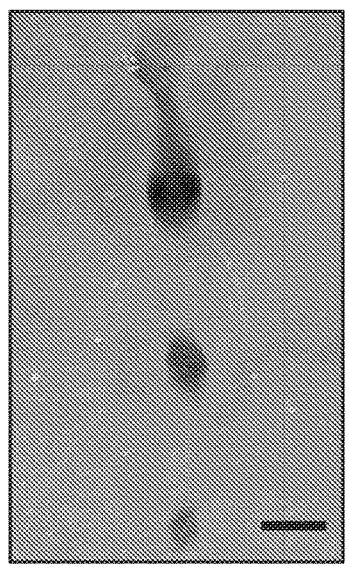
FIG. 14 shows micrographs of solvo-printed lines using deposit liquids with different surface tension by varying the amount of ethylene glycol mixed into the liquid: (a) 0 wt %, (b) 5 wt %, (c) 10 wt %, (d) 15 wt %, (e) 20 wt %. The deposit liquid and carrier liquid pump rate is fixed at 50 μl/hr and 100 μl/hr respectively, the deposit liquid consists of silver nanoparticles with concentration of 6 mg/ml dispersed in water. The substrate used is polyethylene naphthalate which was ozone-treated for 3 min. Scale bars represent 200 μm.
Figure 14B:
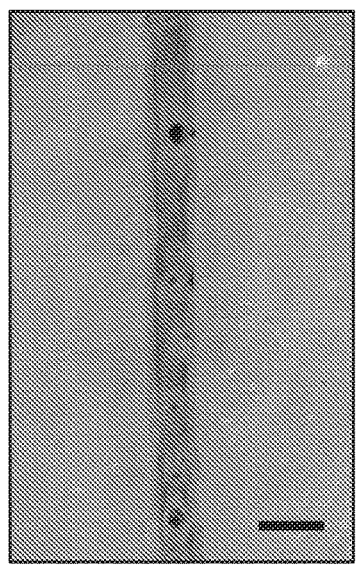
Figure 14C:
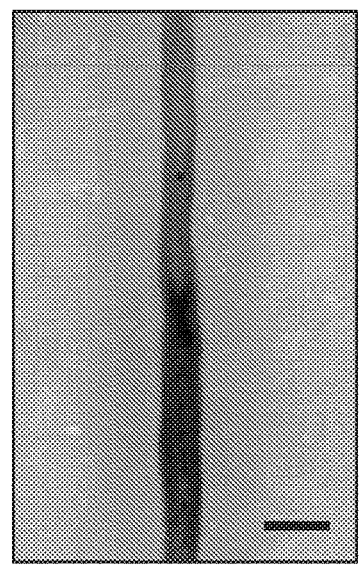
Figure 14D:
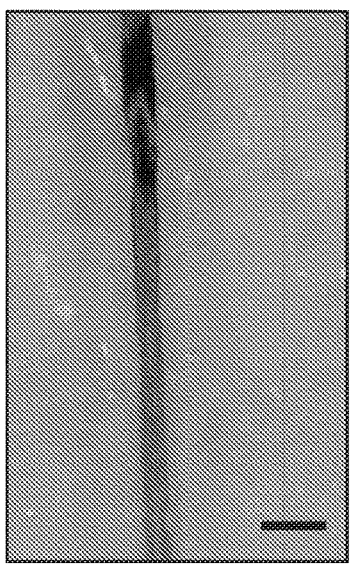
Figure 14E:
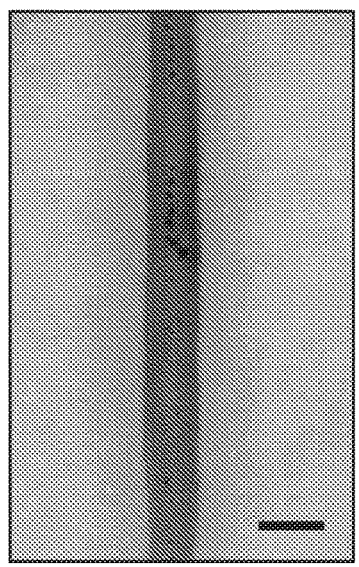

The microfluidic chip with a Y-junction therein is illustrated in FIG. 10, and the apparatus as a whole is shown in FIG. 11.

Deposit Liquid Stream Width

Figure 6A:
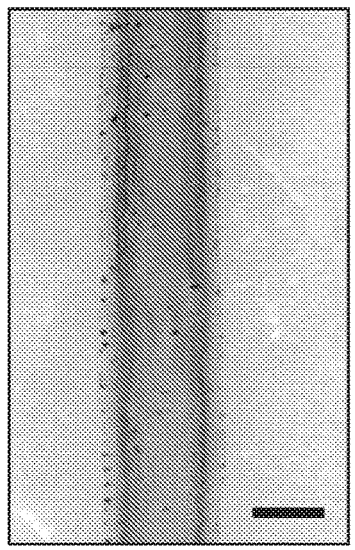
FIG. 6 contains micrograph images of printed lines printed according to the method of the invention. The feed rates of carrier liquid and deposit liquid, $q_c$:$q_d$, are as follows in each case: (a) 0:1; (b) 1:1; (c) 3:1; (d) 5:1; (e) 8:1. The deposit liquid pump rate is fixed at 50 μl/hr, and the deposit liquid consists of silver nanoparticles with concentration of 6 mg/ml dispersed in water with 15 wt % of ethylene glycol. The substrate used is polyethylene naphthalate which was ozone-treated for 3 min. Scale bars in each image represent 200 μm.
Figure 6B:
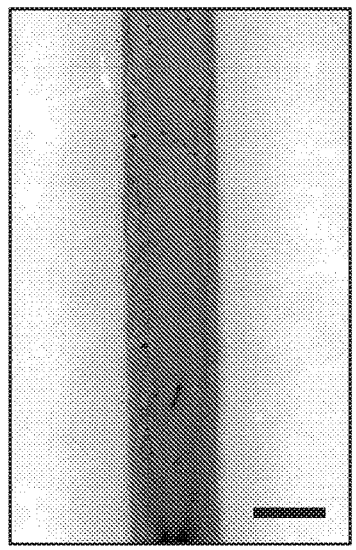
Figure 6C:
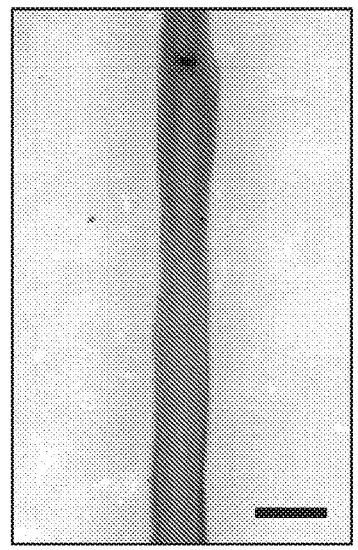
Figure 6D:
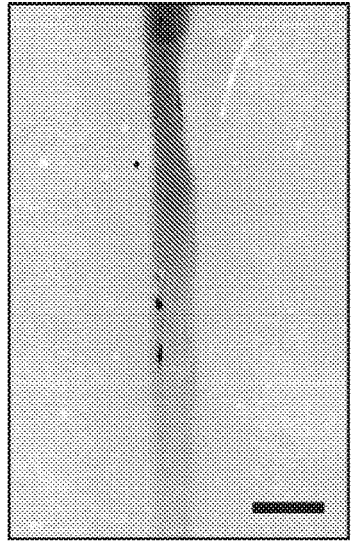
Figure 6E:
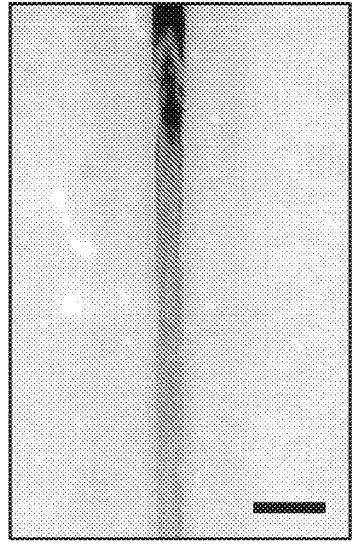
Figure 6F:
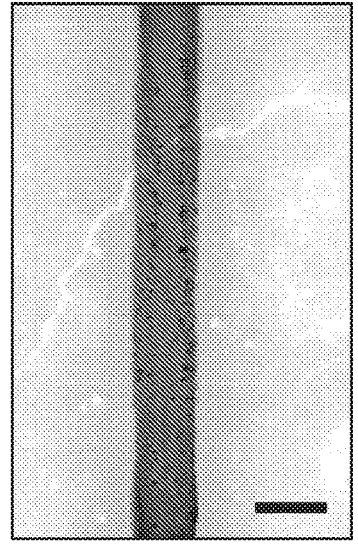
Figure 7A:
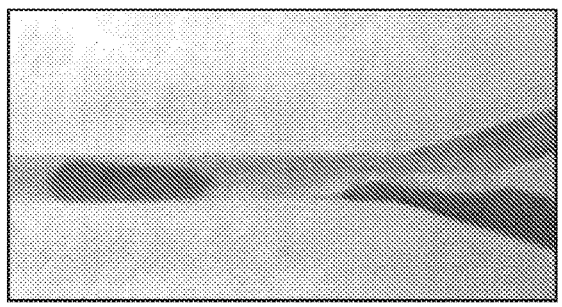
FIG. 7 shows the two flow regimes usually occurring when a deposit liquid and a carrier liquid flow simultaneously through the same flow channel.
Figure 7B:
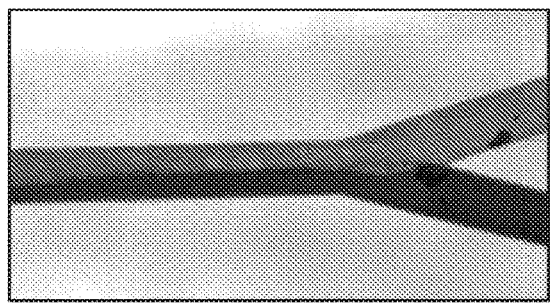

The first example shows how the width of the ink (deposit liquid) stream within the microfluidic channel, denoted by d, affects the width of the final printed line, denoted by w. By controlling the relative pump rate $q_c/q_d$ (Q hereafter), silver nanoparticle ink streams with different widths can be produced and used to print silver lines on the substrate. FIG. 6 shows the micrographs of a set of printed lines using different d. The overall variation in w with changes in d is tabulated in FIG. 12. FIG. 6a shows a line printed without the use of carrier solvent and can therefore be regarded as the control line, meaning d=200 μm. As d decreases, the printed lines become thinner. This shows the proof-of-concept of solvo-dynamic printing as the use of carrier solvent improves the resolution of printing. The value of w decreases to a minimum before increasing again at very low vales of d. This deterioration of resolution can be explained by the increase in ink velocity within a thinner stream. This causes additional ink spreading when the ink is deposited onto the substrate and agrees with studies in literature. The experiment was repeated using inks with different compositions and similar trends were observed.

Deposit Liquid (Ink) Surface Tension

The deposit liquid surface tension at the interface with air, ad, is an important parameter for all existing printing techniques as it affects the deposit liquid wetting behaviour.

Deposit liquids with higher surface tension leads to larger contact angles and therefore less wetting and higher resolution can be achieved. Therefore, in applications which high resolution is required, high surface tension inks (deposit liquids) are employed. However, when the printed features are lines instead of droplets, the surface tension plays another role. Lines of ink deposited onto the substrate during printing are inherently unstable due to higher total interfacial energy between the ink its surroundings. They tend to break up into more energetically stable droplets. This effect is known as the Rayleigh instability. However, stable lines can be formed under certain conditions like having a contact angle less than 90□ or if the receding contact angle is small. These conditions tend to be related to having lower ink (deposit liquid) surface tension. Therefore, high ink (deposit liquid) surface tension is associated with higher resolution but lower stability.

In this example, the deposit liquid surface tension is varied by adding ethylene glycol (EG) as an ink (deposit liquid) cosolvent. EG is chosen as it is water soluble but immiscible with the hexane carrier liquid, and has a lower surface tension than water. Several inks with different EG-water composition was made and their surface tension was calculated from contact angle measurements on substrates with known surface energies using the Equation of States approach developed by Kwok and Neumann. The results are shown in FIG. 13. The ink surface tension decreases with increasing amount of EG as expected. It is also observed that the surface tension of the aqueous ink was found to have a higher surface tension than pure water. This agrees with previous studies done by Tanvir et. al. who found that the presence of nanoparticles tend to increase the surface tension of the resulting suspension.

The different silver nanoparticle inks are then used to print lines using solvo-dynamic printing using Q=2 and 3, which were found to give high resolution in the previous example. The ethylene glycol content in each image is (a) 0 wt %, (b) 5 wt %, (c) 10 wt %, (d) 15 wt %, and (e) 20 wt % respectively.

Figure 15:
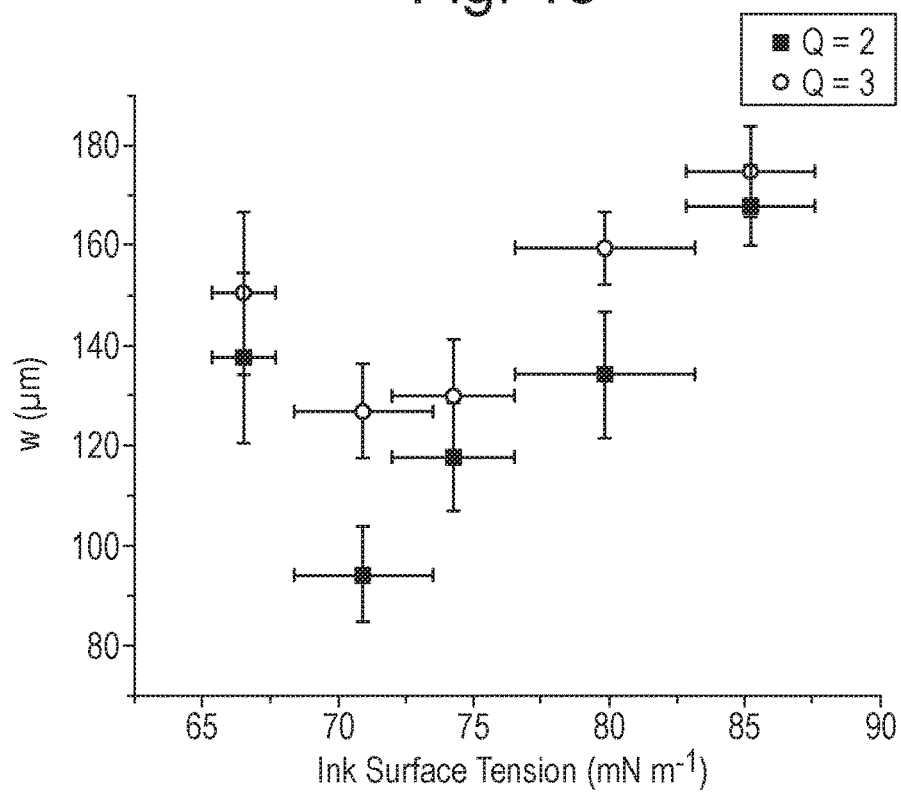
FIG. 15 shows variation in printed line width (w) with the change in deposit liquid surface tension using silver nanoparticle inks with different composition.

FIG. 14 shows the micrograph of the printed lines and the numerical data is tabulated in FIG. 15. It is observed that some of the lines printed with the purely aqueous ink was unstable and broke up into droplets as shown in FIG. 14a. This occurs as the ink has very high surface tension and therefore formed unstable lines as discussed above. For the other inks, stable lines were easily achieved probably due to their lower surface tension. It is observed that as the ink surface tension decreases, the line widths decrease to a minimum and then increases again. This result is quite interesting as lower ink surface tension leads to increased wetting of the substrate and therefore the line width should increase with decreasing surface tension. However, in solvo-dynamic printing, there is some initial improvement in line width with decreasing ink surface tension. This may be due to the improvement in the ink flow focusing effect within the delivery channel since a lower surface tension leads to more stable narrow ink streams.

Substrate Surface Energy

Another important parameter in the process of the invention is the substrate surface energy as it is directly related to the degree of ink wetting. It is well established that solids with higher surface energies relative to the liquid surface tension are more wettable. Therefore, in order to achieve high resolution features, the surface energy of the substrate should not be too high relative to the ink surface tension. However, if the liquid surface tension cannot be too high relative to the substrate surface energy as that would lead to Rayleigh instability in the printed lines.

Figure 16:
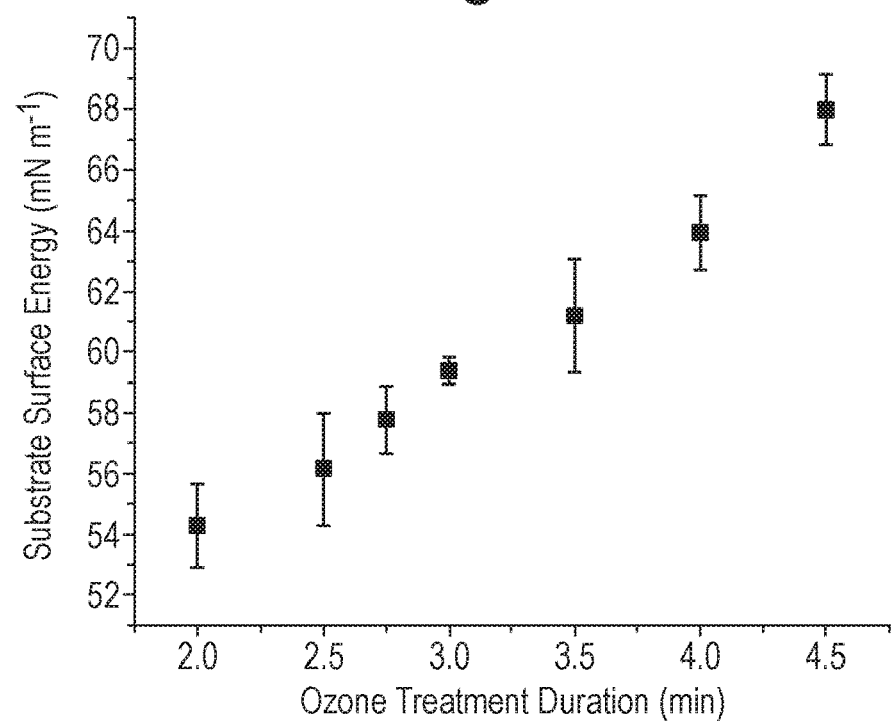
FIG. 16 shows variation in polyethylene naphththalate substrate surface energy with the change in duration under ozone plasma treatment.
Figure 17A:
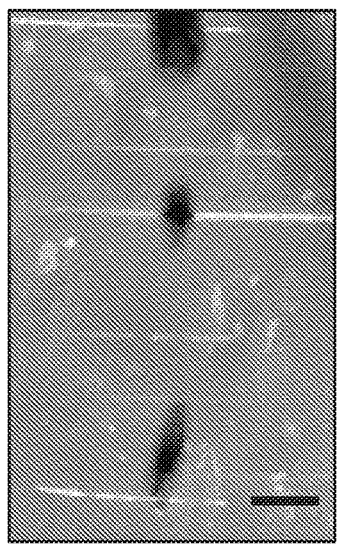
FIG. 17 shows micrographs of solvo-printed lines using polyethylene naphthalate substrates treated by ozone plasma for different times: (a) 2 min, (b) 2.5 min, (c) 3 min, (d) 3.5 min, (e) 4 min and (d) 4.5 min. The ink and carrier solvent pump rate is fixed at 50 μl/hr and 100 μl/hr respectively, ink consists of silver nanoparticles with concentration of 6 mg/ml dispersed in water with 15 wt % of ethylene glycol. Scale bars represent 200 μm.
Figure 17B:
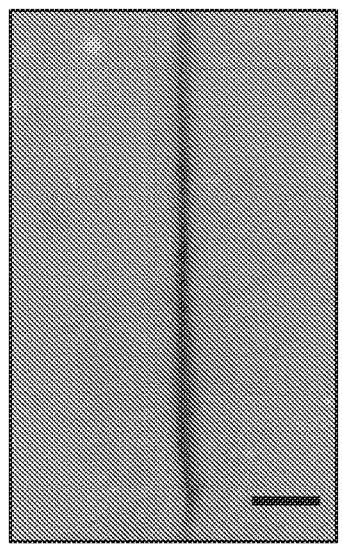
Figure 17C:
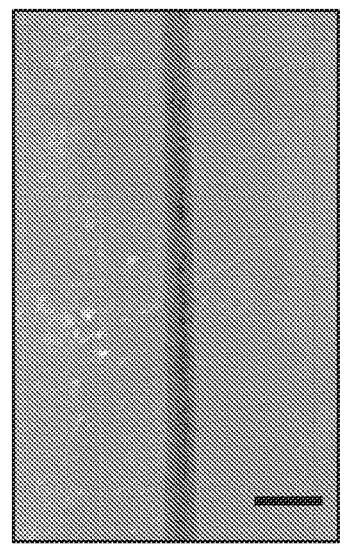
Figure 17D:
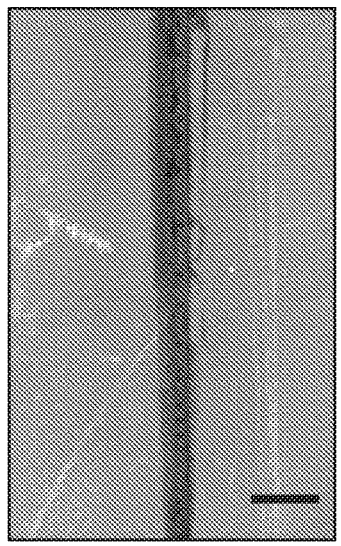
Figure 17E:
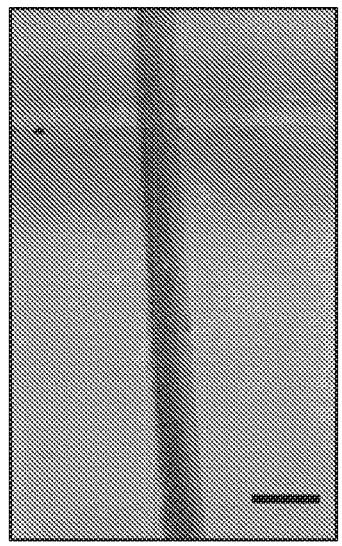
Figure 17F:
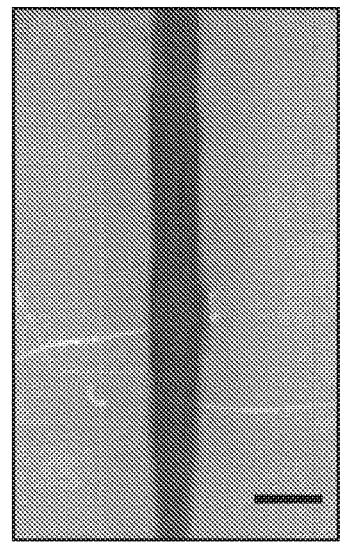

In this example, the polyethylene naphthalate (PEN) substrate's surface energy is controlled by subjecting it to an ozone plasma treatment for different durations. The surface energy of the substrate is then characterized by contact angle measurements with liquids with known surface tensions and calculated using the Equation of States approach. FIG. 16 shows the variation of the PEN surface energy with different plasma treatment durations. Silver lines were then printed according to the process of the invention onto the different substrates. FIG. 17 shows a set of micrographs of the silver nanoparticle lines printed on the different substrates and FIG. 18 shows the overall variation in printed line width on the different substrates. It is observed that the printed line width increases with substrate surface energy. This is as expected since the higher surface energy will cause more ink spreading on the PEN. It is also observed that the sample with the lowest surface energy could not form stable silver lines, probably due to the Rayleigh instability.

Droplet Printing

Figure 19:
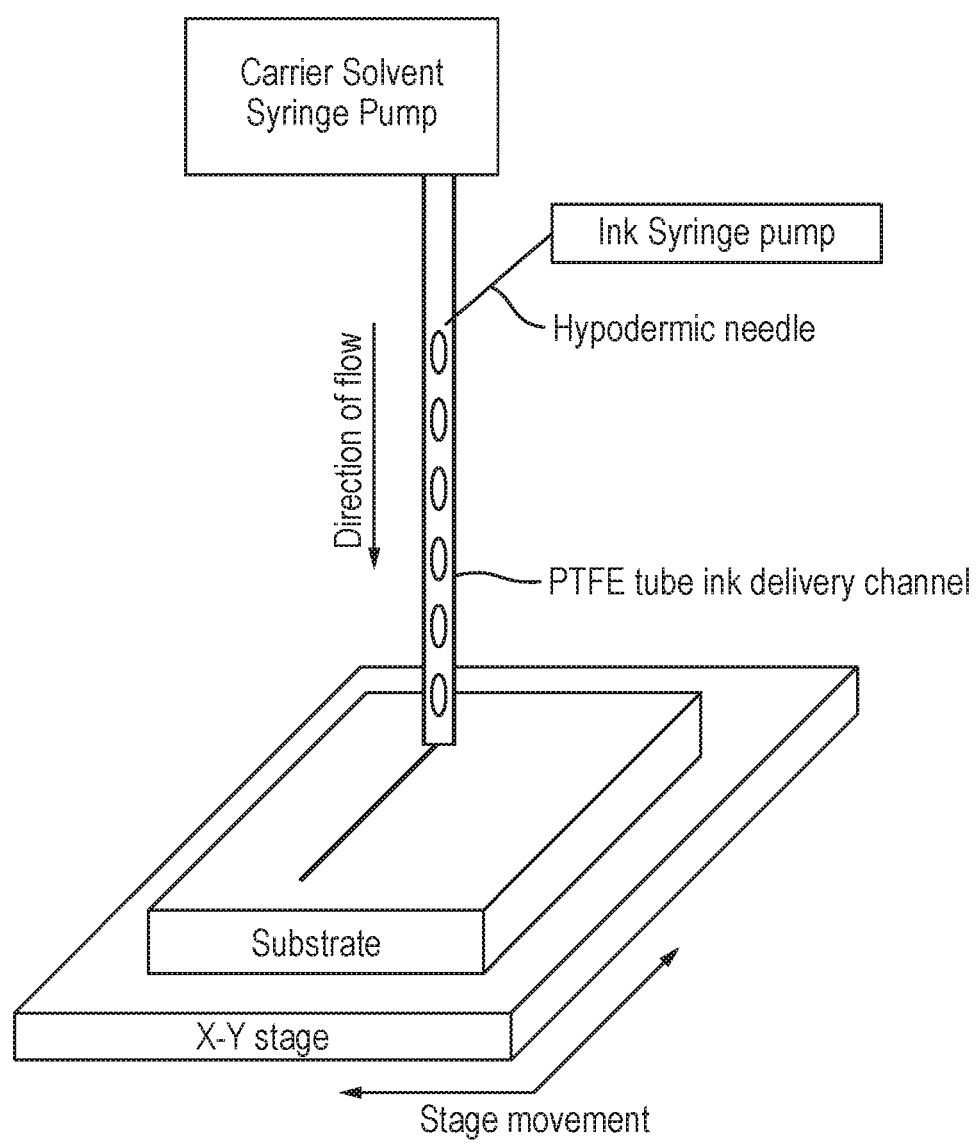
FIG. 19 is a schematic of the setup used to print droplets of deposit liquid.
Figure 20:
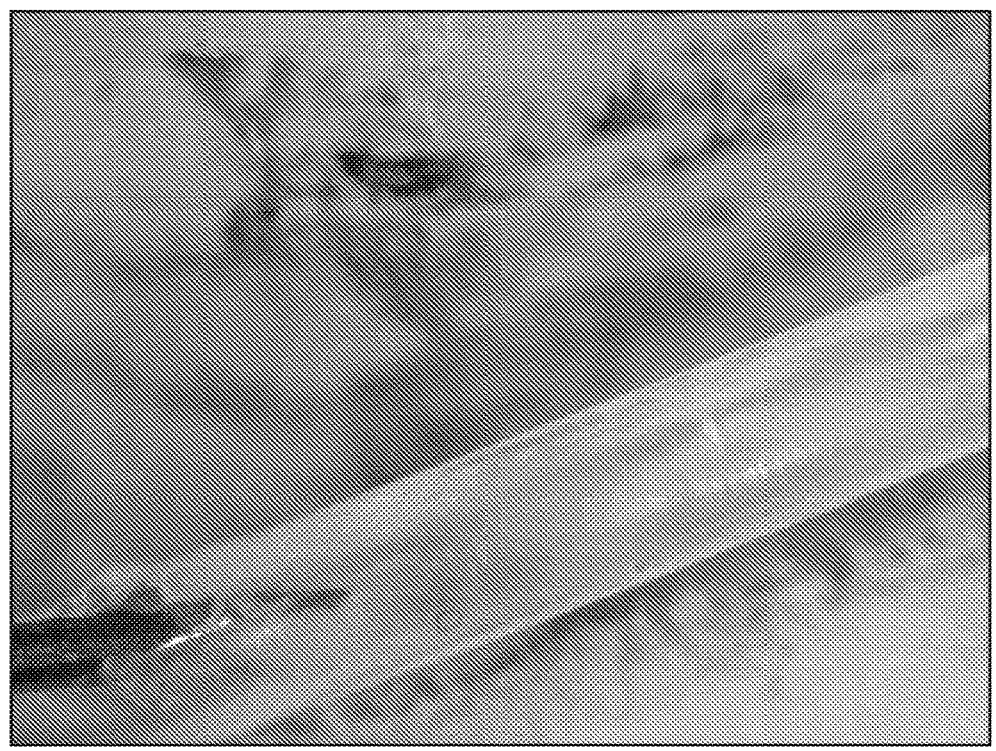
FIG. 20 is a photograph of the junction, in the setup shown schematically in FIG. 19, between the flow of carrier liquid (labelled carrier solvent in FIG. 19), deposit liquid (labelled ink in FIG. 19), and carrier and deposit liquid together.

In this Example, rather than a microfluidic chip, the solvodynamic printing setup consisted of a PTFE tube (inner diameter 300 µm) carrying a carrier liquid (hexane, as in the previous Examples). A 34 g hypodermic needle fed by a syringe pump injected ink (silver nanoparticle ink as in the previous Example) into the stream of carrier solvent. through the wall of the PTFE tube. Phase separation between carrier liquid and ink occurred at the point of injection. The substrate used was polyethylene naphthalate, treated with ozone plasma for 3.5 minutes. The substrate was mounted on an X-Y translational stage to enable its movement relative to the aperture. The motion of the translational stage is set to ensure that the deposit droplets combine on the substrate to form a printed feature in a line shape. The setup is illustrated in FIGS. 19 and 20. FIG. 19 is a schematic of the setup while FIG. 20 is a photograph of the junction between the flow of carrier liquid (labelled carrier solvent), deposit liquid (labelled ink), and carrier and deposit liquid together.

The effect of the ink feed rate, the relative feed rates of ink and carrier liquid, the ink surface tension and the identity of the carrier liquid was varied. The results are shown in FIGS. 21 to 24 and are discussed below.

Figure 21:
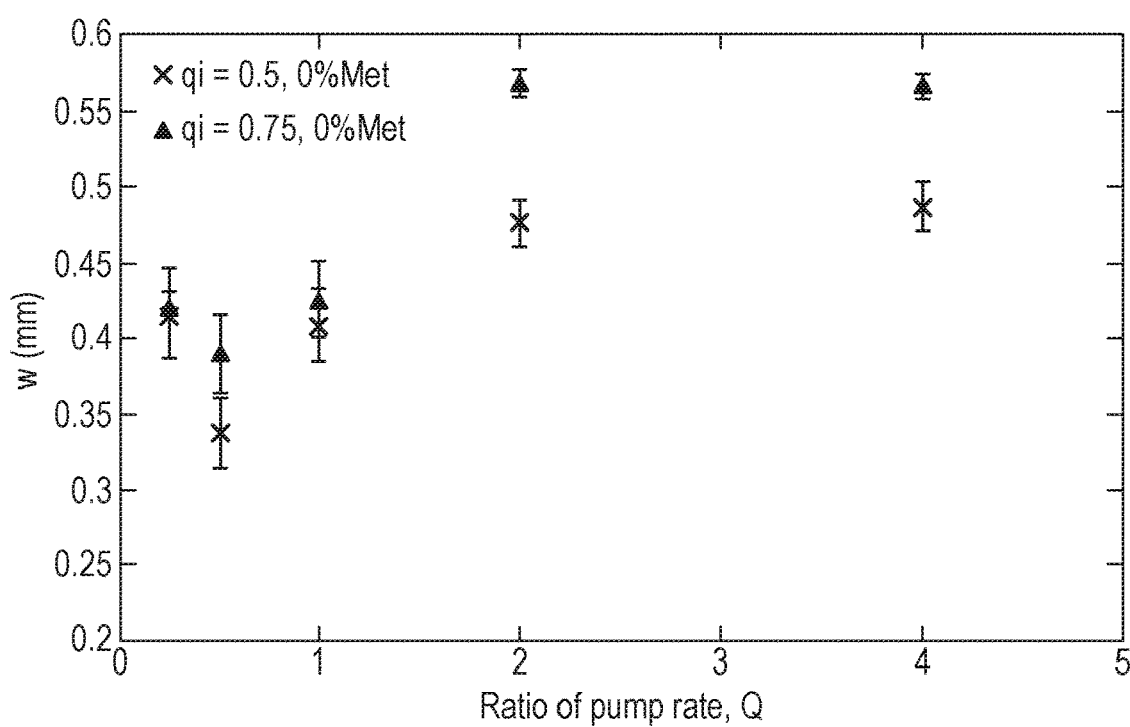
FIG. 21 shows the effect of the feed rate ratio of carrier liquid to deposit liquid, $q_c$/$q_d$ (Q) on the printed line width (w) in discontinuous flow mode. The deposit liquid feed rate is shown as $q_i$ or ink flow rate, as the deposit liquid in this case is an ink. The values of w observed at $q_i$=0.5 ml/hr are lower, while the values of w at $q_i$=0.75 ml/hr are higher at each Q.

FIG. 21 shows the effect of the feed rate ratio of carrier liquid to deposit liquid, $q_c/q_d$ (Q) on the printed line width (w) in discontinuous flow mode. The deposit liquid feed rate $q_d$ is shown on the figure as $q_i$ or ink flow rate, as the deposit liquid used is a silver nanoparticle ink. The values of w observed at $q_i$=0.5 ml/hr are lower, while the values of w at $q_i$=0.75 ml/hr are higher at each Q. The trend observed is that as Q increases, printed feature width (w) decreases to a minimum and then increases again. The initial decrease in w is due to two effects. Firstly, as Q increases the size of ink droplets formed in the PTFE tube (flow channel) decreases. As a result, the contact angle of the ink droplets with the substrate increases and the wetting of the substrate by the ink decreases. However, as Q increases further the flow rate of ink and carrier liquid ($f_d$ and $f_c$ respectively) onto the substrate during deposition increases. This leads to increased splashing and increased ink spreading, causing the deposited features to broaden.

Figure 22:
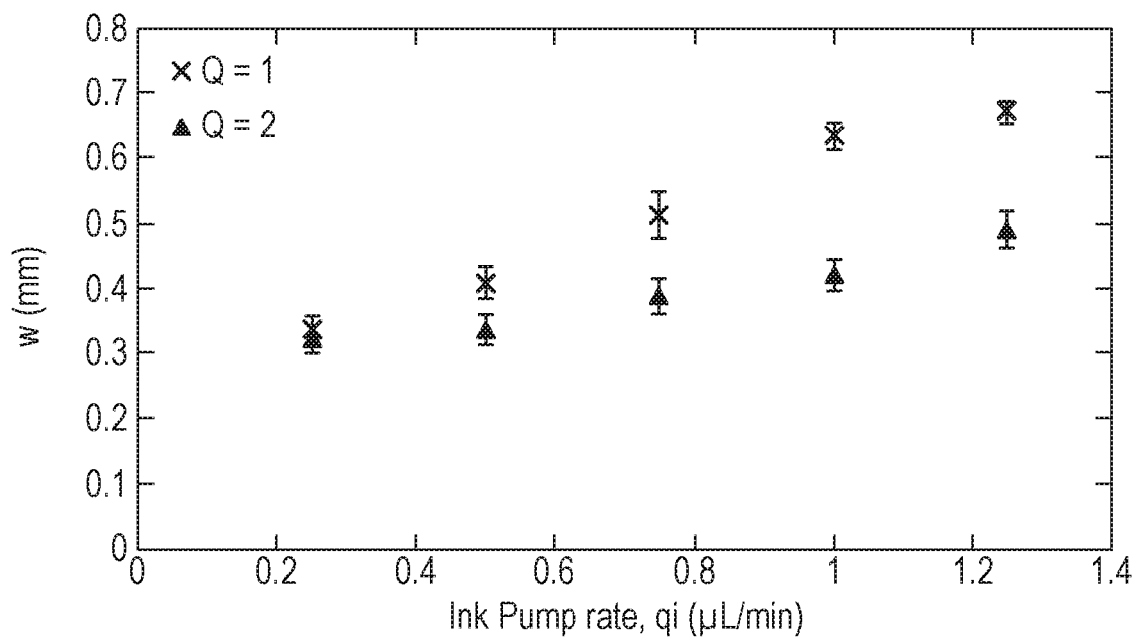
FIG. 22 shows the effect of the pump rate of deposit liquid (ink in this case) on line width (w) at Q=1 and Q=2 in discontinuous flow mode. The width at Q=1 is higher at each ink feed rate $q_i$ than the width at Q=2.

FIG. 22 shows the effect of the pump rate of deposit liquid (ink in this case) on line width (w) at Q=1 and Q=2 in discontinuous flow mode. The width at Q=1 is higher at each ink feed rate $q_i$ than the width at Q=2. The trend observed is that as the ink feed rate increases, the printed feature width w increases. This is because the increased feed rate of the ink forms larger ink droplets in the PTFE tube and increases the amount of ink deposited per unit length of the printed line.

Figure 23:
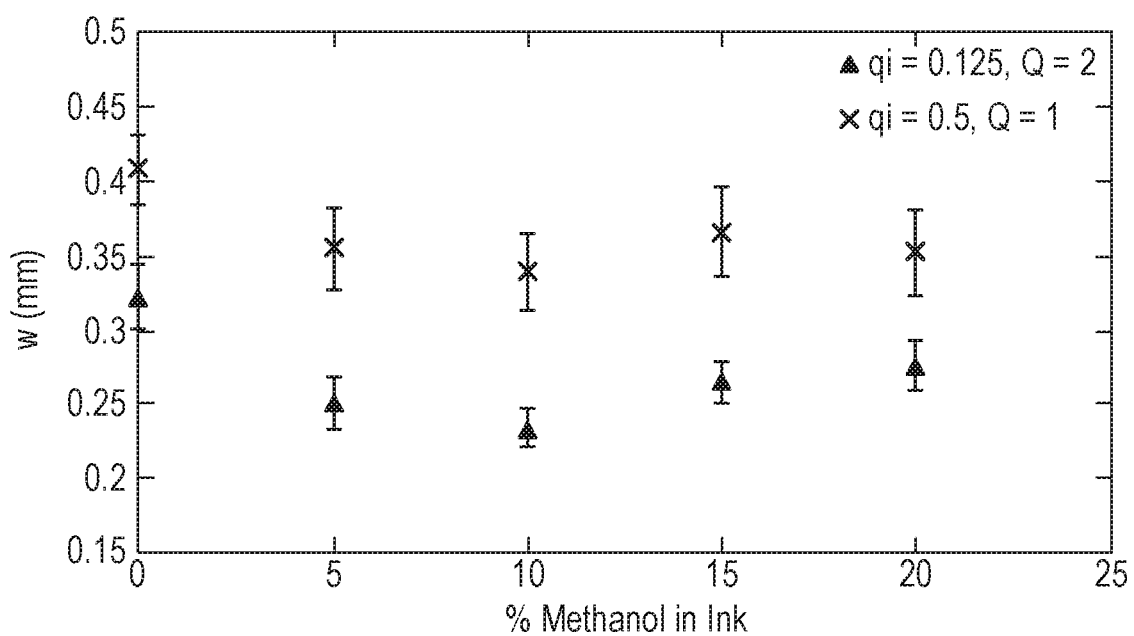
FIG. 23 shows the effect of deposit liquid (ink) surface tension on line with (w) in discontinuous flow mode. Methanol is added to decrease surface tension. Two sets of data are taken. The data where the ink feed rate $q_i$ is 0.125 and the feed rate ratio Q is 2 shows a lower line width for each surface tension than the data where the ink feed rate $q_i$ is 0.5 and the feed rate ratio Q is 1. Various trends are observed.

FIG. 23 shows the effect of deposit liquid (ink) surface tension on line with (w) in discontinuous flow mode. Methanol is added to decrease surface tension. The percentage by weight of methanol in the ink is shown along the bottom axis. Two sets of data are taken. The data where the ink feed rate $q_i$ is 0.125 and the feed rate ratio Q is 2 shows a lower line width for each surface tension than the data where the ink feed rate $q_i$ is 0.5 and the feed rate ratio Q is 1.

As the content of methanol increases. the surface tension decreases and the printed line width decreases to a minimum and then increases. The initial decrease in w is due to smaller ink droplets forming as the interfacial tension between ink and the carrier liquid decreases. This makes the formation of a large number of small droplets (having a high surface area) less energetically unfavourable. However, as the surface tension increases the degree of ink spreading on the substrate increases. Where the percentage of methanol in the ink exceeds approximately 10%, the former effect no longer outweighs the latter and the line width rises above the minimum reached at 10%.

Figure 24:
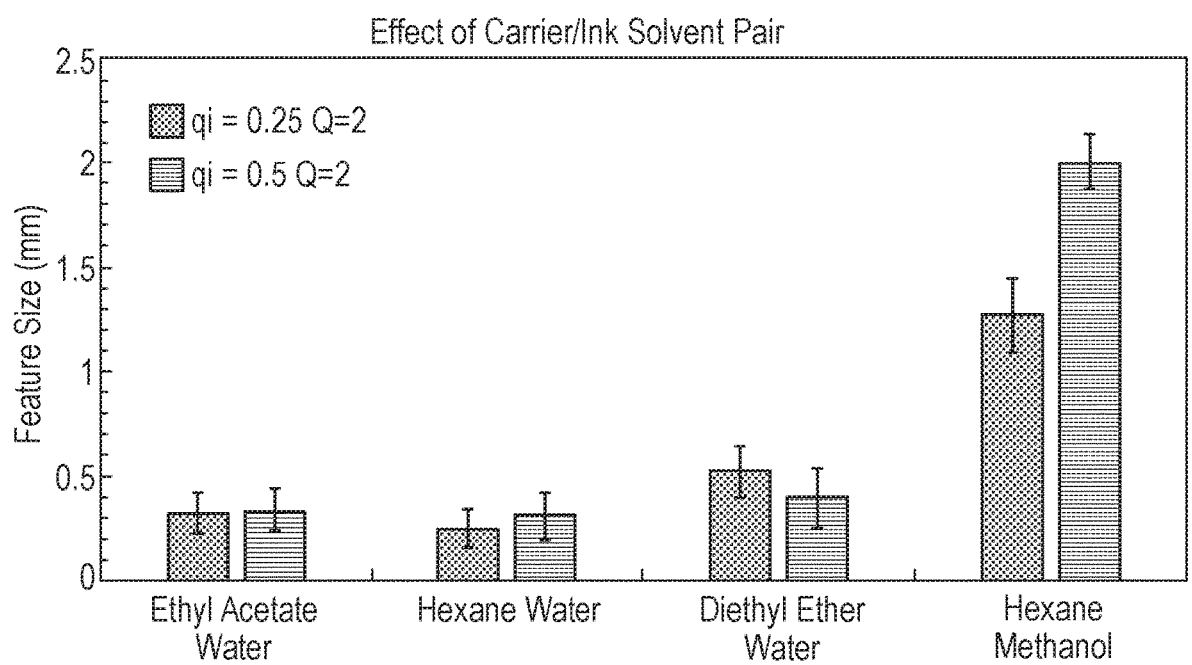
FIG. 24 shows the effect of varying the identity of the carrier liquid on the resolution of the printing technique in discontinuous flow mode. The deposit liquid comprised water in all cases. Two sets of data were taken, one at an ink pump rate of 0.25 and the other at an ink pump rate of 0.5.

FIG. 24 shows the effect of varying the identity of the carrier liquid on the resolution of the printing technique in discontinuous flow mode. The deposit liquid was a silver nanoparticle ink as above in all cases and Q=2. Two sets of data were taken, one at an ink pump rate of 0.25 and the other at an ink pump rate of 0.5. A control experiment was also performed where no carrier liquid was used.

Regardless of the nature of the carrier liquid, in all cases the presence of the carrier liquid decreased the line width relative to that in the absence of carrier liquid and so improved printing resolution. The degree of improvement varied with the nature of the carrier liquid. The overall improvement in each case is due to the combined effects of (i) forming ink droplets in different sizes (influenced by factors including flow rate, viscosity of ink, interfacial tension between ink and carrier liquid) and (ii) the reduction in the degree of ink wetting on the substrate (influenced by a balance of surface tensions as in Equation 2).

The invention claimed is:

1. A process for producing a printed article, wherein the process comprises:
    passing a deposit liquid through an aperture and passing a carrier liquid through an aperture, which may be the same aperture, to form a volume of the deposit liquid in a volume of the carrier liquid on a substrate,
wherein the deposit liquid is immiscible with the carrier liquid, and
wherein a contact angle of the deposit liquid with the substrate in the carrier liquid (θ*) is approximately equal to or greater than a contact angle of the deposit liquid with the substrate in the absence of carrier liquid in a medium in which the process is performed (θ).

2. A process according to claim 1, wherein:
    (a) the deposit liquid is denser than the carrier liquid; and/or
    (b) the viscosity of the carrier liquid differs from the viscosity of the deposit liquid; and/or
    (c) the surface tension of the deposit liquid differs from the surface tension of the carrier liquid.

3. A process according to claim 1, wherein the process further comprises removing the volume of the carrier liquid from around the volume of the deposit liquid.

4. A process according to claim 1 wherein the process comprises passing the deposit liquid and the carrier liquid through the same aperture simultaneously to form said volume of the deposit liquid in said volume of the carrier liquid on the substrate.

5. A process according to claim 1, wherein the process comprises providing the deposit liquid at a feed rate $q_d$ and providing the carrier liquid at a feed rate $q_c$, optionally wherein the ratio $q_c/q_d$ is at least 1, optionally from 2:1 to 25:1.

6. A process according to claim 1 wherein the deposit liquid flows through an aperture at a flow rate $f_d$ and wherein the carrier liquid flows through an aperture, which may be the same aperture, at a flow rate $f_c$, optionally wherein $f_c/f_d$ is at least 1, optionally wherein the ratio $f_c:f_d$ is from 2:1 to 25:1.

7. A process according to claim 1 wherein the process comprises:
    passing the deposit liquid and the carrier liquid through the same aperture simultaneously,
        the aperture having a cross-sectional area A, and
        the deposit liquid having a cross-sectional area A' as it passes through the aperture, A' being smaller than A,
    to form said volume of the deposit liquid in said volume of the carrier liquid on the substrate.

8. A process according to claim 7 wherein A' is 95% of A or less, optionally wherein A' is from 5% to 80% of A.

9. A process according to claim 1 wherein the process comprises moving the substrate relative to the aperture or apertures.

10. A process according to claim 1 wherein the process comprises:
    providing the deposit liquid at a feed rate $q_d$ and providing the carrier liquid at a feed rate $q_c$;
    establishing a parallel flow of the deposit liquid and the carrier liquid to an aperture;
    passing the deposit liquid and the carrier liquid through the said aperture simultaneously to form said volume of the deposit liquid in said volume of the carrier liquid on the substrate, and simultaneously moving the substrate relative to the aperture; and
    removing the volume of the carrier liquid from around the volume of the deposit liquid,
wherein the deposit liquid is immiscible with the carrier liquid.

11. A process according to claim 1 wherein the process comprises:
    providing a discontinuous flow of the deposit liquid to an aperture;
    passing the deposit liquid through an aperture and passing a carrier liquid through an aperture onto the substrate; and
    moving the substrate relative to the aperture or apertures, to form a plurality of volumes of the deposit liquid in a volume or volumes of the carrier liquid on the substrate; and
    removing the volume(s) of the carrier liquid from around the volumes of the deposit liquid;
wherein the deposit liquid is immiscible with the carrier liquid;
optionally wherein the deposit liquid and the carrier liquid are passed through an aperture simultaneously;
further optionally wherein the deposit liquid and the carrier liquid pass through the same aperture.

12. A process according to claim 11 wherein the said discontinuous flow of the deposit liquid is a flow of droplets of the deposit liquid.

13. A process according to claim 1 wherein the deposit liquid comprises one or more of:

(a) a deposit material and a solvent;
(b) an ink;
(c) a deposit material which is a conductive material;
(d) a solvent which is a polar solvent;
(e) a viscosifying agent; and
(f) an agent for modifying its surface tension.

14. A process according to claim 1 wherein the deposit liquid and/or the carrier liquid comprise an agent for reducing the interfacial tension between the deposit liquid and the carrier liquid.

15. A process according to claim 1 wherein the carrier liquid comprises a non-polar solvent and/or an agent for modifying its surface tension, optionally wherein the deposit liquid comprises a polar solvent.

16. A process according to claim 1 wherein the substrate is a solid material.

17. A process according to claim 1 wherein the substrate comprises a deposition surface, and the volume or volumes of the deposit liquid and the volume or volumes of the carrier liquid are deposited on said deposition surface, optionally wherein the deposition surface is substantially flat.

18. A process according to claim 1 wherein the substrate is treated:
    (a) to increase its surface energy; and/or
    (b) to decrease its contact angle with the deposit liquid; and/or
    (c) to increase its wettability,
optionally wherein the surface of the substrate is treated by being exposed to ozone plasma.

19. A process according to claim 1 wherein the step of removing the volume of the carrier liquid from around the volume of the deposit liquid comprises:
    (a) allowing the carrier liquid to evaporate; and/or
    (b) heating the substrate having one or more volumes of deposit liquid and one or more volumes of carrier liquid thereon; and/or
    (c) washing the substrate having one or more volumes of deposit liquid and one or more volumes of carrier liquid thereon.

20. A process according to claim 1 wherein the process comprises a step of converting a volume of deposit liquid to a solid, optionally by
    (a) irradiating the deposit; and/or
    (b) where the deposit liquid comprises a solvent, by evaporating said solvent.

21. A printed article obtainable by the process defined in claim 1.

22. A process for producing a printed article, wherein the process comprises:
    passing a deposit liquid through an aperture and passing a carrier liquid through an aperture, which may be the same aperture, to form a volume of the deposit liquid in a volume of the carrier liquid on a substrate,
    wherein the deposit liquid is immiscible with the carrier liquid, and
    wherein the process comprises moving the said substrate relative to the said aperture or apertures to form the said volume of the deposit liquid and the said volume of carrier liquid in an elongated shape.

* * * * *